United States Patent
Brunner et al.

(10) Patent No.: US 11,668,924 B2
(45) Date of Patent: Jun. 6, 2023

(54) CONTROL STRUCTURE FOR OSCILLATORS WITH NONLINEAR FREQUENCY RESPONSE

(71) Applicant: Infineon Technologies AG, Neubiberg (DE)

(72) Inventors: David Brunner, Dobersberg (AT); Franz Michael Darrer, Graz (AT); Georg Schitter, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 674 days.

(21) Appl. No.: 16/749,270

(22) Filed: Jan. 22, 2020

(65) Prior Publication Data
US 2021/0223536 A1 Jul. 22, 2021

(51) Int. Cl.
| | |
|---|---|
| G02B 26/08 | (2006.01) |
| G01S 17/26 | (2020.01) |
| H03L 7/085 | (2006.01) |
| H03L 7/099 | (2006.01) |
| G01S 7/481 | (2006.01) |
| G02B 26/10 | (2006.01) |
| H03L 7/06 | (2006.01) |
| H03B 5/30 | (2006.01) |

(52) U.S. Cl.
CPC ........ *G02B 26/0833* (2013.01); *G01S 7/4817* (2013.01); *G01S 17/26* (2020.01); *G02B 26/0841* (2013.01); *G02B 26/105* (2013.01); *H03B 5/30* (2013.01); *H03L 7/06* (2013.01); *H03L 7/085* (2013.01); *H03L 7/0991* (2013.01)

(58) Field of Classification Search
CPC .............. G01S 7/4817; G02B 26/0841; G02B 26/0833; G02B 26/10; G02B 26/105; G02B 26/101; H04N 9/3135; H04N 9/3194; H03L 7/06; H03B 5/30
See application file for complete search history.

(56) References Cited

U.S. PATENT DOCUMENTS

| | | | |
|---|---|---|---|
| 8,446,571 B2 | 5/2013 | Fiess et al. | |
| 9,759,909 B1* | 9/2017 | Tauscher | G02B 26/0841 |
| 2016/0341955 A1* | 11/2016 | McVittie | G02B 26/101 |

OTHER PUBLICATIONS

J. Kokavecz, et al., "Novel Amplitude and Frequency Demodulation Algorithm for a Virtual Dynamic Atomic Force Microscope", Institute of Physics Publishing, Nanotechnology 17, (2006), S173-S177.

* cited by examiner

*Primary Examiner* — Ryan Johnson
(74) *Attorney, Agent, or Firm* — Harrity & Harrity, LLP

(57) ABSTRACT

An oscillator control system includes an non-linear oscillator structure configured to oscillate about an axis; a driver circuit configured to generate a driving signal to drive the oscillator structure; a detection circuit configured to measure an angle amplitude and a phase error of the oscillator structure; an amplitude controller configured to generate a reference oscillator period based on the measured angle amplitude; a period and phase controller configured to receive the reference oscillator period and the measured phase error from the detection circuit, generate at least one control parameter of the driving signal based on the reference oscillator period and the measured phase error, and determine a driving period of the driving signal based on the reference oscillator period and the measured phase error. The driver circuit is configured to generate the driving signal based on the at least one control parameter and the driving period.

26 Claims, 8 Drawing Sheets

CONTROL STRUCTURE FOR OSCILLATORS WITH NONLINEAR FREQUENCY RESPONSE

FIELD

The present disclosure relates generally to a microelectromechanical system (MEMS) oscillating system and method for operating the same, and, more particularly, to controlling oscillating structures in a MEMS oscillating system.

BACKGROUND

Light Detection and Ranging (LIDAR), is a remote sensing method that uses light in the form of a pulsed laser to measure ranges (variable distances) to one or more objects in a field of view. In particular, a microelectromechanical system (MEMS) mirror is used to scan light across the field of view. Arrays of photodetectors receive reflections from objects illuminated by the light, and the time it takes for the reflections to arrive at various sensors in the photodetector array is determined. This is also referred to as measuring time-of-flight (TOF). LIDAR systems form depth measurements and make distance measurements by mapping the distance to objects based on the time-of-flight computations. Thus, the time-of-flight computations can create distance and depth maps, which may be used to generate images.

A LIDAR scanning system may include one or more scanning mirrors and corresponding circuitry for scanning different field of views in the horizontal and/or vertical direction. Each scanning mirror is a non-linear oscillator with a dependency between angle amplitude and frequency. If an oscillator with a non-linear frequency response is influenced by external, perhaps unobservable, disturbances, the oscillator may change its oscillation amplitude and in turn its frequency due to its nonlinear dependency. Usually a phase-locked loop (PLL) that drives the oscillator measures both, angle amplitude and oscillator phase, and adapts the driving period according to the phase and some other control quantity according to the amplitude (e.g., the driving voltage). Since amplitude measurements are prone to be noisier than phase measurements, the driving period is adapted rather fast while the amplitude control is slow in comparison. Therefore, fast changes in amplitude are not compensated. Furthermore, the PLL always follows the oscillator period instead of pushing the oscillator to the desired period and in turn to the desired amplitude.

Therefore, an improved control structure for oscillators with a non-linear frequency response may be desirable.

SUMMARY

Embodiments provide a control structure for angle amplitude and phase control of nonlinear oscillators that have a nonlinear dependency between the amplitude and the frequency.

One or more embodiments provide an oscillator control system that includes an oscillator structure configured to oscillate about an axis, where an angle amplitude and a frequency of the oscillator structure have a non-linear dependency; a driver circuit configured to generate a driving signal to drive an oscillation of the oscillator structure; a detection circuit configured to measure the angle amplitude and a phase error of the oscillator structure; an outer control loop including an amplitude controller configured to generate a reference oscillator period based on the measured angle amplitude; an inner control loop including a period and phase controller configured to receive the reference oscillator period from the outer control loop and the measured phase error from the detection circuit, generate at least one control parameter of the driving signal based on the reference oscillator period and the measured phase error, and determine a driving period of the driving signal based on the reference oscillator period and the measured phase error, where the driver circuit is configured to generate the driving signal based on the at least one control parameter of the driving signal and the driving period. The driver circuit is configured to generate the driving signal based on the at least one control parameter and the driving period.

One or more embodiments provide a method for controlling an oscillator structure configured to oscillate about an axis according to a driving signal, where an angle amplitude and a frequency of the oscillator structure have a non-linear dependency. The method includes measuring the angle amplitude of the oscillator structure; measuring the phase error of the of the oscillator structure; generating a reference oscillator period based on the measured angle amplitude; generating at least one control parameter of the driving signal based on the reference oscillator period and the measured phase error, including adapting the at least one control parameter of the driving signal to compensate for the measured phase error; determining a driving period of the driving signal based on the reference oscillator period and the measured phase error, including adapting the driving period to compensate for the measured phase error; and generating the driving signal based on the at least one control parameter of the driving signal and the driving period.

One or more embodiments provide a Light Detection and Ranging (LIDAR) control system that includes: a microelectromechanical system (MEMS) mirror configured to oscillate about an axis, where an angle amplitude and a frequency of the MEMS mirror have a non-linear dependency; a driver circuit configured to generate a driving signal to drive an oscillation of the MEMS mirror; a detection circuit configured to measure the angle amplitude and a phase error of the MEMS mirror; an outer control loop including an amplitude controller configured to generate a reference mirror period based on the measured angle amplitude; and an inner control loop including a period and phase controller configured to receive the reference mirror period from the outer control loop and the measured phase error from the detection circuit, generate at least one control parameter of the driving signal based on the reference mirror period and the measured phase error, and determine a driving period of the driving signal based on the reference mirror period and the measured phase error, where the driver circuit is configured to generate the driving signal based on the at least one control parameter of the driving signal and the driving period.

BRIEF DESCRIPTION OF THE DRAWINGS

Embodiments are described herein making reference to the appended drawings.

DETAILED DESCRIPTION

Figure 1A:
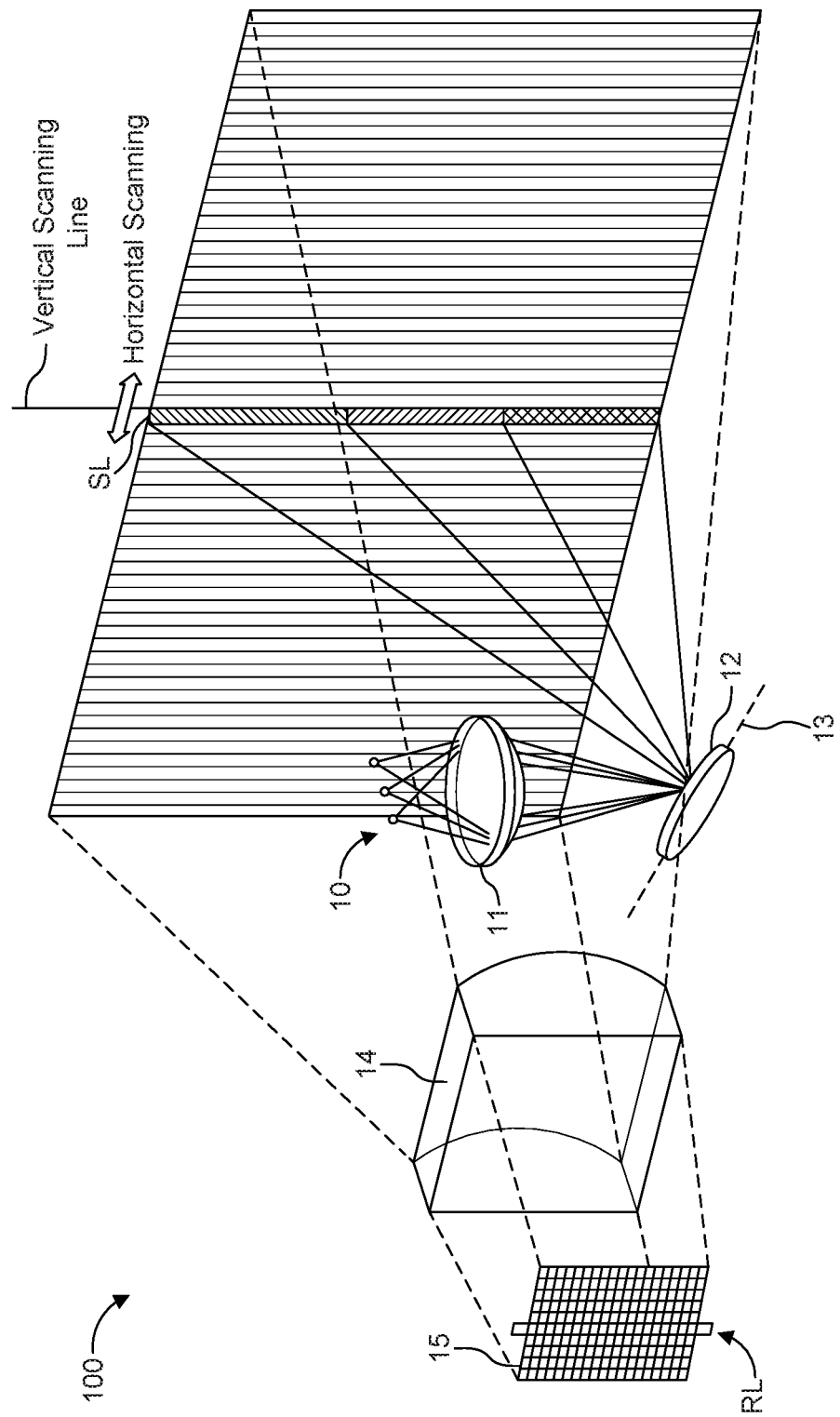
FIG. 1A is a schematic diagram of a LIDAR scanning system in accordance with one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photons of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

In Light Detection and Ranging (LIDAR) systems, a light source transmits light pulses into a field of view and the light reflects from one or more objects by backscattering. In particular, LIDAR is a direct Time-of-Flight (TOF) system in which the light pulses (e.g., laser beams of infrared light) are emitted into the field of view, and a pixel array detects and measures the reflected beams. For example, an array of photodetectors receives reflections from objects illuminated by the light.

Differences in return times for each light pulse across multiple pixels of the pixel array can then be used to make digital 3D representations of an environment or to generate other sensor data. For example, the light source may emit a single light pulse, and a time-to-digital converter (TDC) electrically coupled to the pixel array may count from the time the light pulse is emitted, corresponding to a start signal, until a time the reflected light pulse is received at the receiver (i.e., at the pixel array), corresponding to a stop signal. The "time-of-flight" of the light pulse is then translated into a distance.

In another example, an analog-to-digital converter (ADC) may be electrically coupled to the pixel array (e.g., indirectly coupled with intervening elements in-between) for pulse detection and ToF measurement. For example, an ADC may be used to estimate a time interval between start/stop signals with an appropriate algorithm. For example, an ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC) with an appropriate algorithm.

A scan such as an oscillating horizontal scan (e.g., from left to right and right to left of a field of view) or an oscillating vertical scan (e.g., from bottom to top and top to bottom of a field of view) can illuminate a scene in a continuous scan fashion. Each firing of the laser beam by the light sources can result in a scan line in the "field of view." By emitting successive light pulses in different scanning directions, an area referred to as the field of view can be scanned and objects within the area can be detected and imaged. Thus, the field of view represents a scanning plane having a center of projection. A raster scan could also be used.

FIG. 1A is a schematic diagram of a LIDAR scanning system 100 in accordance with one or more embodiments. The LIDAR scanning system 100 is an optical scanning device that includes a transmitter, including an illumination unit 10, a transmitter optics 11, and a one-dimensional (1D) microelectromechanical system (MEMS) mirror 12, and a receiver, including a second optical component 14 and a photodetector detector array 15.

The illumination unit 10 includes multiple light sources (e.g., laser diodes or light emitting diodes) that are linearly aligned in single bar formation and are configured to transmit light used for scanning an object. The light emitted by the light sources is typically infrared light although light with another wavelength might also be used. As can be seen in the embodiment of FIG. 1A, the shape of the light emitted by the light sources is spread in a direction perpendicular to the transmission direction to form a light beam with an oblong shape perpendicular to a transmission. The illumination light transmitted from the light sources are directed towards the transmitter optics 11 configured to focus each laser onto a one-dimensional MEMS mirror 12. The transmitter optics 11 may be, for example, a lens or a prism.

When reflected by the MEMS mirror 12, the light from the light sources are aligned vertically to form for each emitted laser shot a one-dimensional vertical scanning line SL of infrared light or a vertical bar of infrared light. Each light source of the illumination unit 10 contributes to a different vertical region of the vertical scanning line SL. Thus, the light sources may be concurrently activated and concurrently deactivated to obtain a light pulse with multiple segments, where each segment corresponds to a respective light source, However, each vertical region or segment of the vertical scanning line SL may also be independently active or inactive by turning on or off a corresponding one of the light sources of the illumination unit 10. Thus, a partial or full vertical scanning line SL of light may be output from the system 100 into the field of view.

Accordingly, the transmitter of the system 100 is an optical arrangement configured to generate laser beams based on the laser pulses, the laser beams having an oblong shape extending in a direction perpendicular to a transmission direction of the laser beams.

In addition, while three laser sources are shown, it will be appreciated that the number of laser sources are not limited thereto. For example, the vertical scanning line SL may be generated by a single laser source, two laser sources or more than three laser sources.

The MEMS mirror 12 is a mechanical moving mirror (i.e., a MEMS micro-mirror) integrated on a semiconductor chip (not shown). The MEMS mirror 12 according to this embodiment is suspended by mechanical springs (e.g., leaf springs, sometimes referred to as cantilever beams) or flexures and is configured to rotate about a single axis and can be said to have only one degree of freedom for movement. Due to this single axis of rotation, the MEMS mirror 12 is referred to as a 1D MEMS mirror.

In order to make a MEMS scanning mirror robust against vibrations, the mirror should have a low inertia, i.e., a light and stiff mirror body. In addition, the mirror should have a high stiffness of its suspension for all degrees-of-freedom (DOF) of the mirror body.

In order to achieve a light and stiff mirror body, the mirror body may comprise a relatively thin mirror and a thicker reinforcement structure for the mirror. The mirror body may be rotatably arranged in a mirror frame around a rotation axis extending in a plane defined by the mirror frame. The rotation axis may extend to first and second mutually opposite end-portions of the mirror body. The mirror may have a reflective plane on a first main surface and opposite the first main surface a second main surface provided with the reinforcement structure.

Figure 1B:
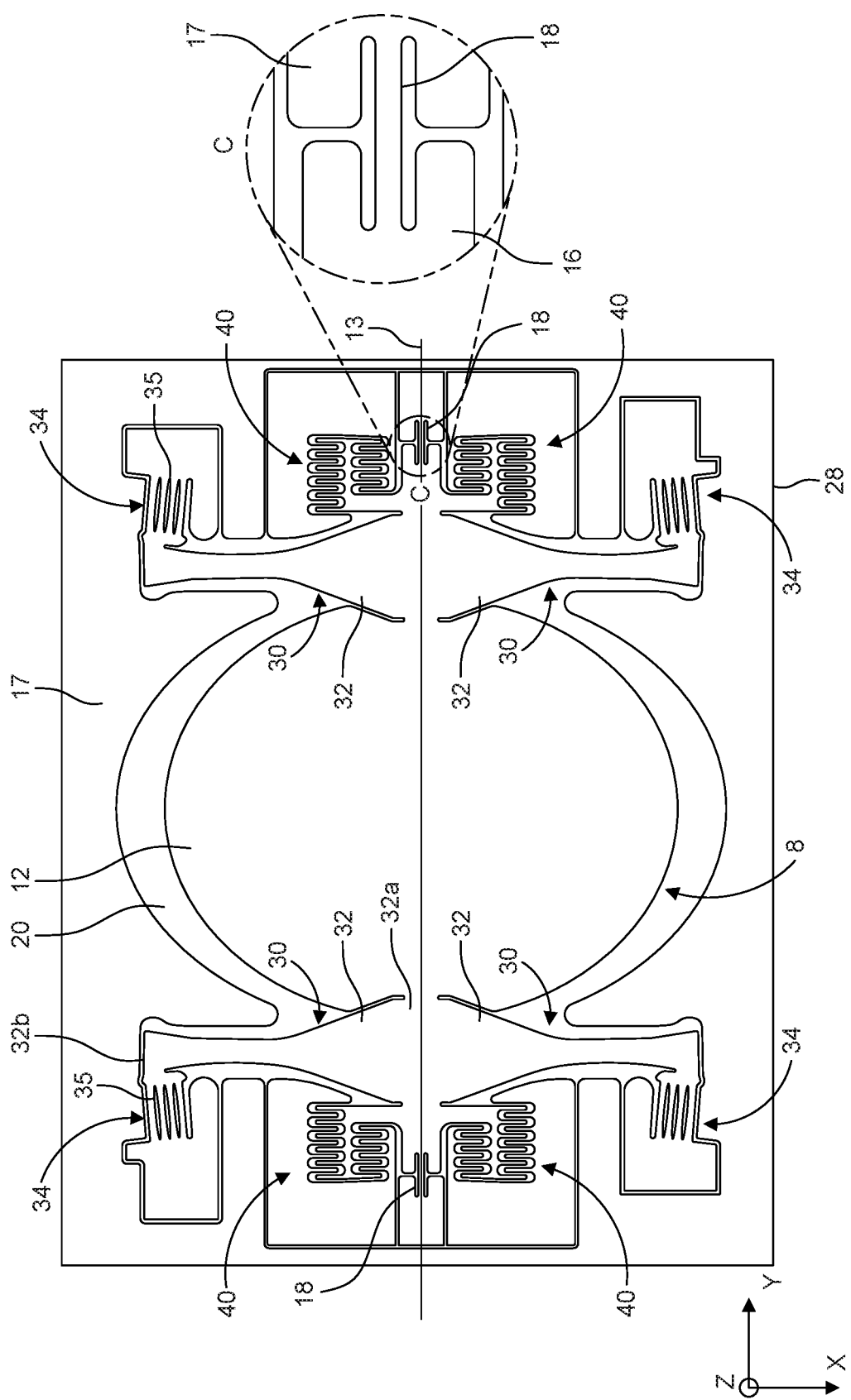
FIG. 1B shows a schematic top view of an example of a mirror device in accordance with one or more embodiments.

In order to achieve a high stiffness suspension, the mirror body may be supported in the mirror frame using support beams extending along the rotation axis and additional cantilever beam or leaf spring assemblies, as illustrated in FIG. 1B. Generally, as defined herein, leaf spring assemblies may be referred to a cantilever beam assemblies, and vice versa. Similarly, leaf springs and cantilever beams may be used interchangeably.

A cantilever beam assembly may have a longitudinal direction and may extend within the plane defined by the frame. The support beams may be connected between the mirror body and the frame at two opposite ends of the mirror body along the rotation axis. The cantilever beam assembly may have a cantilever beam coupled at a first end via a relief structure to the mirror frame and fixed at a second end to the mirror body. The cantilever beam may have a thickness, perpendicular to a plane of the frame, that is smaller than its width in the plane of the frame.

Results of the low inertia and the high suspension stiffness of the mirror body may be high resonance frequencies a good dynamic performance. These properties may also make the device which is operated at the resonance frequency around the main axis of rotation very fast. In normal operation, i.e., at resonance, accelerations at the mirror tips of typically 10000 G may be achieved. This may make any external vibration negligible.

The MEMS mirror 12 exhibits a non-linear behavior due the stiffness of the suspension structure (i.e., the cantilever beams) such that an oscillation frequency of the mirror increases with an increase in oscillation amplitude (i.e., tilt angle amplitude) in a non-linear manner. Thus, the stiffening of the suspension causes the MEMS mirror 12 to be more strongly non-linear.

Figure 2:
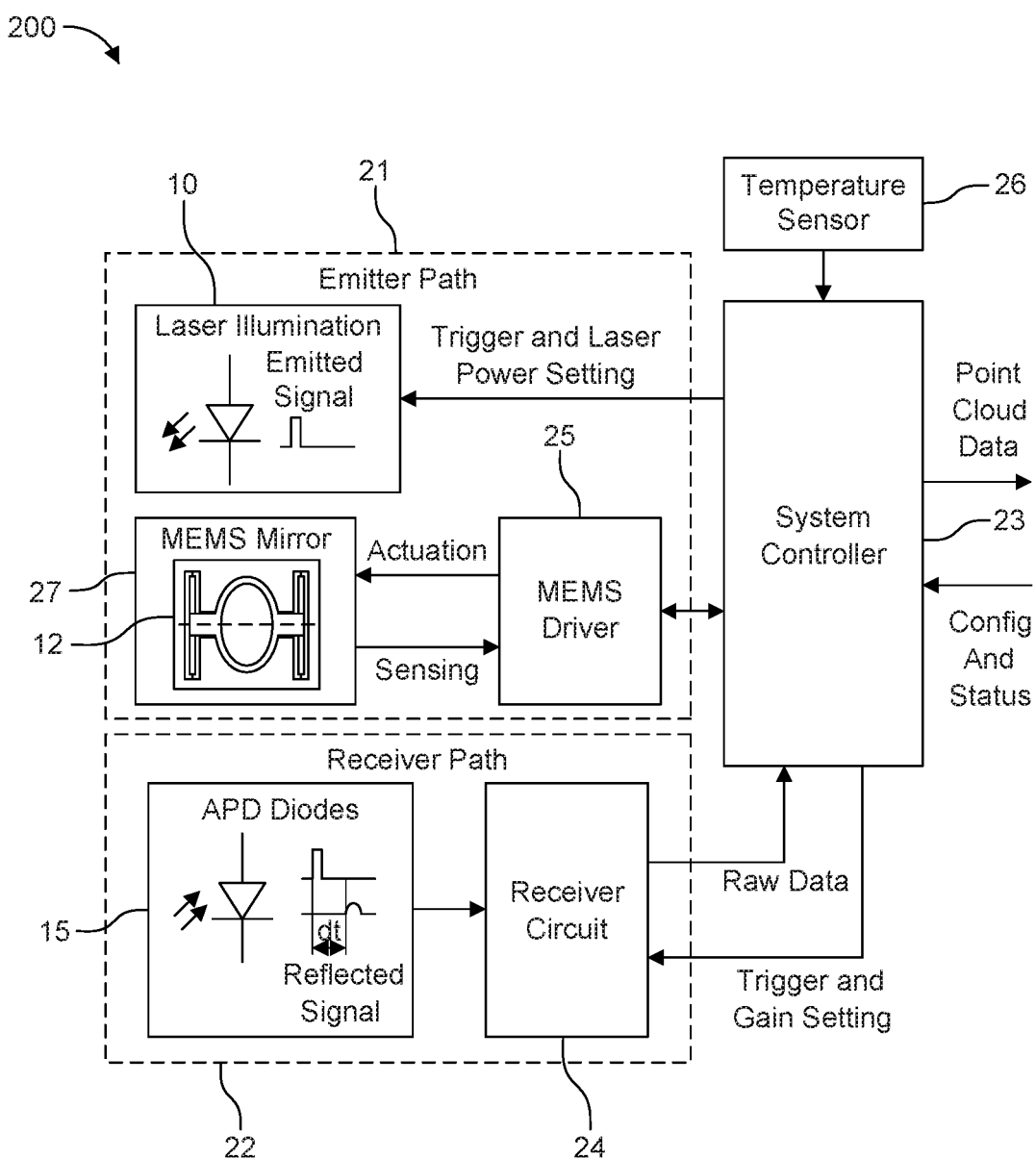
FIG. 2 is a schematic block diagram of the LIDAR scanning system in accordance with one or more embodiments.

The MEMS mirror 12 may be assembled in a chip package 27 shown in FIG. 2 to protect the mirror. For example, the MEMS mirror 12 may be hermetically sealed at a low pressure (i.e., at a pressure lower than atmospheric pressure) in a chip package. This low pressure may provide a low damping environment in which the MEMS mirror 12 operates.

Conceivable packages may include or differ by one or more of the following variants: different substrates (e.g., metal (leadframe), ceramic, organic (similar to printed circuit board (PCB) material)), and different optical lids or covers (e.g., optical material of glass, silicon, sapphire, etc.). Furthermore, the optical lids or covers may be cavity-forming caps, may be integrated into a frame (e.g., a metal frame), or assembled onto a pre-mold cavity or a ceramic cavity.

One or more methods (e.g., adhesive bonding, gluing, soldering, welding, and the like) or one or more different materials (e.g., silicone, glass solder, AuSn, and the like) may be used to bond one or more elements together (e.g., joining cap or lid to substrate). It will be appreciated that bonding methods may be interchangeable across various embodiments disclosed herein.

Alternatively, a wafer-level approach may be used such that a cavity-shaped lid may be directly mounted onto the MEMS chip (or even on wafer-level prior to singulation). Here, if the lid attachment leaves the electrical pads exposed, the sub-mount chip/lid can further be processed into a package using molding or casting processes.

The MEMS mirror 12 is a mechanical moving mirror (i.e., a MEMS micro-mirror) integrated on a semiconductor chip (not shown). The MEMS mirror 12 according to this embodiment is configured to rotate about a single scanning axis and can be said to have only one degree of freedom for scanning. Distinguished from 2D-MEMS mirrors (2D MEMS scanners), in the 1D MEMS mirror, the single scanning axis is fixed to a non-rotating substrate and therefore maintains its spatial orientation during the oscillation of the MEMS mirror. Thus, a 1D oscillating MEMS mirror is by design more robust against vibrations and shocks than 2D MEMS mirror solutions. Due to this single scanning axis of rotation, the MEMS mirror 12 is referred to as a 1D MEMS mirror or 1D MEMS scanner. While embodiments describe using 1D oscillating MEMS mirrors, the synchronization methods described herein can be extended to 2D MEMS mirrors as well. In this case, both axes of a single 2D MEMS mirror are controlled by a different phase-locked loops (PLLs) such that a first scanning direction of the 2D MEMS mirrors according to a first axis are synchronized according to any of the synchronization techniques described herein, and a second scanning direction of the 2D MEMS mirrors according to a second axis are synchronized according to any of the synchronization techniques described herein. It is further possible that the different PLLs are provided in separate MEMS drivers or integrated into a single MEMS driver for each 2D MEMS mirror.

The MEMS mirror 12 itself is a non-linear resonator (i.e., a resonant MEMS mirror) configured to oscillate "side-to-side" about a single scanning axis 13 at a resonance frequency such that the light reflected from the MEMS mirror 12 (i.e., the vertical scanning line of light) oscillates back and forth in a horizontal scanning direction. The MEMS mirror 12 is more strongly non-linear due to the stiffening of the suspension. A scanning period or an oscillation period is defined, for example, by one complete oscillation from a first edge of the field of view (e.g., left side) to a second edge of the field of view (e.g., right side) and then back again to the first edge. A mirror period of the MEMS mirror 12 corresponds to a scanning period.

Thus, the field of view is scanned in the horizontal direction by the vertical bar of light by changing the angle of the MEMS mirror 12 on its scanning axis 13. For example, the MEMS mirror 12 may be configured to oscillate at a resonance frequency of 2 kHz, between +/−15 degrees to steer the light over +/−30 degrees making up the scanning range of the field of view. Thus, the field of view may be scanned, line-by-line, by a rotation of the MEMS mirror 12 through its degree of motion. One such sequence through the degree of motion (e.g., from −15 degrees to +15 degrees) is referred to as a single scan or scanning cycle. Multiple scans may be used to generate distance and depth maps, as well as 3D images by a processing unit.

While the transmission mirror is described in the context of a MEMS mirror, it will be appreciated that other 1D mirrors can also be used. In addition, the resonance frequency or the degree of rotation is not limited to 2 kHz and +/−15 degrees, respectively, and both the resonance frequency and the field of view may be increased or decreased according to the application. Thus, a one-dimensional scanning mirror is configured to oscillate about a single scanning axis and direct the laser beams at different directions into a field of view. Hence, a transmission technique includes transmitting the beams of light into the field of view from a transmission mirror that oscillates about a single scanning axis such that the beams of light are projected as a vertical scanning line SL into the field of view that moves horizontally across the field of view as the transmission mirror oscillates about the single scanning axis.

Upon impinging one or more objects, the transmitted bar of vertical light is reflected by backscattering back towards the LIDAR scanning system 100 as a reflected vertical line where the second optical component 14 (e.g., a lens or prism) receives the reflected light. The second optical component 14 directs the reflected light onto the photodetector detector array 15 that receives the reflected light as a receiving line RL and is configured to generate electrical measurement signals. The electrical measurement signals may be used for generating a 3D map of the environment and/or other object data based on the reflected light (e.g., via TOF calculations and processing).

The receiving line is shown as a vertical column of light that extends along one of the pixel columns in a lengthwise direction of the pixel column. The receiving line has three regions that correspond to the vertical scanning line SL shown in FIG. 1A. As the vertical scanning line SL moves horizontally across the field of view, the vertical column of light RL incident on the 2D photodetector array 15 also moves horizontally across the 2D photodetector array 15. The reflected light beam RL moves from a first edge of the photodetector detector array 15 to a second edge of the photodetector detector array 15 as the receiving direction of the reflected light beam RL changes. The receiving direction of the reflected light beam RL corresponds to a transmission direction of the scanning line SL.

The photodetector array 15 can be any of a number of photodetector types; including avalanche photodiodes (APD), photocells, and/or other photodiode devices. Imaging sensors such as charge-coupled devices (CCDs) can be the photodetectors. In the examples provided herein, the photodetector array 15 is a two-dimensional (2D) APD array that comprises an array of APD pixels. In other embodiments, the photodetector array 15 may be a 1D array that includes a single column of photodiodes. The activation of the photodiodes may be synchronized with light pulses emitted by the illumination unit 10. Alternatively, a single photo detector call/pixel, as opposed to an array, may be used. For example, a single photo detector call/pixel may be used in case of a 2×1D scanning transmitter in a coaxial LIDAR architecture.

The photodetector array 15 receives reflective light pulses as the receiving line RL and generates electrical signals in response thereto. Since the time of transmission of each light pulse from the illumination unit 10 is known, and because the light travels at a known speed, a time-of-flight computation using the electrical signals can determine the distance of objects from the photodetector array 15. A depth map can plot the distance information.

In one example, for each distance sampling, a microcontroller triggers a laser pulse from each of the light sources of the illumination unit 10 and also starts a timer in a Time-to-Digital Converter (TDC) Integrated Circuit (IC). The laser pulse is propagated through the transmission optics, reflected by the target field, and captured by an APD of the APD array 15. The APD emits a short electrical pulse which is then amplified by an electrical signal amplifier. A comparator IC recognizes the pulse and sends a digital signal to the TDC to stop the timer. The TDC uses a clock frequency to calibrate each measurement. The TDC sends the serial data of the differential time between the start and stop digital signals to the microcontroller, which filters out any error reads, averages multiple time measurements, and calculates the distance to the target at that particular field position. By emitting successive light pulses in different directions established by the MEMS mirror, an area (i.e., a field of view) can be scanned, a three-dimensional image can be generated, and objects within the area can be detected.

Alternatively, instead of using the TDC approach, ADCs may be used for signal detection and ToF measurement. For example, each ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC) with an appropriate algorithm.

It will be appreciated that the above-described horizontal scanning system 100 may also be used for vertical scanning. In this case, the scanning arrangement is arranged such that the scanning direction is rotated 90° such that the scanning line SL and the receiving line RL move in the vertical direction (i.e., from top to bottom or from bottom to top). As such, the scanning line is a horizontal scanning line SL that is projected into the field of view that moves vertically across the field of view as the transmission mirror oscillates about the single scanning axis. Furthermore, as the horizontal scanning line SL moves vertically across the field of view, the horizontal column of light RL incident on the 2D photodetector array 15 also moves vertically across the 2D photodetector array 15.

It will be further appreciated that a LIDAR scanning system may include multiple scanning mirrors 12 and corresponding circuitry for scanning different field of views in the horizontal and/or vertical direction. For example, a vehicle may include multiple scanning mirrors arranged at different locations on the vehicle to scan different field of views. Alternatively, the synchronized MEMS mirrors can be used in a 2×1D system, such as a Lissajous scanning system. In this case, the MEMS mirrors are mounted in the same location in the vehicle and are configured to scan a same field of view.

FIG. 1B shows a schematic top view of an example of a mirror device in accordance with one or more embodiments. Referring to FIG. 1B, an example of a mirror device, such as a MEMS scanning micro mirror, is now explained. The mirror device comprises a mirror body 8. The mirror body 8 comprises a mirror 12 and a mirror support 16. The mirror device further includes a frame 17. The mirror body 8 is arranged in the frame 17. The frame 17 defines a plane, i.e., the (x, y) plane in FIG. 1B. The plane defined by the frame 17 may be parallel to planes defined by main surfaces of a layer or a plurality of layers in which the frame 17 is formed.

The mirror body 8 is rotatable around a rotation axis 13 extending in the plane de-fined by the frame 17. Support beams 18, which may also be referred to as torsion beams, are connected between the mirror body 8 and the frame 17 along the rotation axis 13. To be more specific, a first support beam 18 is connected between a first end of the mirror body 8 and the frame 17 and a second support beam 18 is connected between a second end of the mirror body 8 and the frame 17, where the second end of the mirror body 8 is opposite to the first end in the direction of the rotation axis 13. An enlarged view of one of the support beams 18 is shown in the enlarged portion C in the right hand side of FIG. 1B. As can be seen, support beams 18 connect parts of mirror support 16 to parts of frame 17 and permit the mirror body 8 to be rotated around rotation axis 13. The support beams 18 may be collinear with the rotation axis 13.

Those skilled in the art will appreciate that the shape of the mirror 12 can be any shape desired for a particular application, e.g., a circle, ellipse, square, rectangle or other shape as desired.

The mirror frame 17 defines a mirror recess 20 in which the mirror body 8 is arranged. The mirror recess 20 is defined by a recess periphery 28 of the mirror frame 17. The mirror frame 17 may also be structured to define further recesses in which other components may be arranged, such as actuators and leaf spring assemblies.

The mirror device includes at least one leaf spring assembly 30. In the example shown, the mirror device includes two pairs of leaf spring assemblies 30, where the leaf spring assembly in each pair extends from the mirror body 8 in opposite directions. In the example shown, the leaf spring assemblies 30 are arranged symmetrically with respect to the axis of rotation 13.

The at least one leaf spring assembly 30 includes a leaf spring 32 and a relief link 34. The relief link 34 may have one or more relief springs 35. The leaf spring 32 includes a first end 32a and a second end 32b. The first end 32a is coupled to the mirror body 8 and the second end is coupled to the frame 17. Each leaf spring 32 has a longitudinal direction or extension between the first end 32a and the second end 32b. The first end 32a is fixed to the mirror support (not illustrated) and the second end 32b is coupled to frame 17 via the relief link 34. In the examples, the first ends 32a of two leaf springs 32 extending from the same portion of the mirror body 8 in different directions may be connected to each other (e.g., the leaf springs of the left side of the mirror 12 or the leaf springs on the right side of the mirror 12).

In some examples, the shape of the mirror 12 may include concave portions in the region of the axis of rotation 13, wherein portions of the leaf springs 32 extend into the concave portions of the mirror 12. In some examples, leaf springs 32 and mirror 12 may be formed in a same layer of material and may be connected to each other adjacent the axis of rotation 13.

In some examples, the leaf springs 32 may be implemented in a single crystal silicon layer having a direction of lower material stiffness, where the leaf springs have their longitudinal direction aligned with the direction of lower material stiffness. In some examples, the leaf springs 32 may be implemented in a silicon layer having a <100> axis and the leaf springs have their longitudinal direction aligned with the <100> direction which in this case has the lower material stiffness.

Torsional stiffness about the rotation axis 13 may be set using the leaf spring assemblies 30. The pair of support beams 18 supports the mirror body 8 vertically, i.e., perpendicular to a main surface of the frame 17, at the rotation axis 13. However, the support beams 18 may have a negligible effect on the torsional stiffness, so that the natural frequency of the mirror body may be substantially determined by the leaf spring assemblies 30. The natural frequency may be substantially independent of the support beams 18. The natural frequency as defined herein is the undamped frequency of the mirror body 8 (i.e., the mirror 12) about its rotation axis 13. The support beams 18 may define the out-of-plane rocking and vertical mode stiffness for the corresponding dynamic modes and corresponding resonance frequencies. The torsional stiffness can be decoupled from the out-of-plane rocking and vertical mode stiffness so that the out-of-plane rocking and vertical mode frequencies can be set to desired values, such as higher values, without influencing the torsional mode stiffness and resonance frequency. As defined herein, the Y axis is along the rotation axis 13, the X axis is perpendicular to the Y axis on the mirror plane when the mirror 12 is at rest, and the Z axis is perpendicular to and out of the mirror plane when the mirror 12 is at rest. The X, Y, and Z axis are axes of a tree dimensional Cartesian coordinate system.

In the example shown in FIG. 1B, one end of the at least one leaf spring 32 is connected to the mirror body 8 at a location close to the rotation axis 13. The other end 32b is connected to the associated relief link 34 at a location further away from the rotation axis 13. The leaf spring assemblies 30 may provide torsional stiffness to the mirror body 8 about the rotation axis 13. The relief links 34 may provide a compliant or flexible coupling from the leaf springs 32 to the frame 17. The relief links 34 may have a relatively low stiffness longitudinal to the leaf springs 32, i.e., in X direction in FIG. 1B, which allows one end of the leaf springs 32 to move in their longitudinal direction when the mirror body 8 rotates around the rotation axis 13. The relief links 34 may have a relatively high stiffness in the transverse direction, i.e., in Z direction and in Y direction in FIG. 1B.

The resonance frequency for rotation of the mirror 12 around the rotation axis 13 may be defined mainly by the inertia of the mirror body 8 and the stiffness of the leaf spring assemblies 30, which may be defined by the bending stiffness of the leaf springs 32 and by the torsional and translational stiffness of the relief links 34. The bending stiffness of the leaf springs 32 may be defined by the length, width, and, in particular, the thickness of the leaf springs 32. The combined stiffness in X direction of the support beams 18 and the relief links 34 may prevent movement of the mirror body 8 perpendicular to the rotation axis 13 (in the X direction) during operation. More detail on the relief links is provided be-low.

The support beams 18 are connected between the frame 17 and the mirror body 8 along the rotation axis 13 to support the mirror body 8 in the frame 17. In one example, the support beams 18 have narrow rectangular cross-sections perpendicular to the rotation axis 13, with the long axis of the rectangle perpendicular to the face of the mirror 12 and the mirror body 8, and the short axis of the rectangle parallel to the face of the mirror 12. The torsional stiffness corresponding to a rotation of the mirror body 8 around rotation axis 13 may be provided by the leaf spring assemblies 30. The support beams 18 may serve only for support of the mirror body 8 and may have a negligible effect on the torsional stiffness. The support beams 18 may be sized so that the stiffness against vertical displacement (in Z direction) of the mirror body 8 and against its out-of-plane translation perpendicular to the rotation axis 13 (the X axis) may be as high as possible.

The mirror device may also include at least one actuator 40 to provide torque to drive the mirror body 8 about the rotation axis 13. In one example, the actuator may include mirror combs attached to the mirror body 8 interleaved with frame combs attached to the frame 17. Applying a difference in electrical potential between interleaved mirror combs and frame combs may create a driving force between the mirror combs and the frame combs, which may create a torque on the mirror body 8 about the rotation axis 13. An oscillating electrical potential can be applied to drive the mirror device at its natural frequency.

In other examples, actuation methods may include electromagnetic actuation and piezoelectric actuators. In electromagnetic actuation, the micro mirror may be "immersed" in a magnetic field and an alternating electric current through conductive paths may create the oscillating torque around the rotation axis 13. Piezoelectric actuators may be integrated in the leaf springs or the leaf springs may be made of piezoelectric material to produce alternating beam bending forces in response to an electrical signal and generate the oscillation torque.

The MEMS mirror 12 exhibits a non-linear behavior due the torsional stiffness about the rotation axis 13 caused by the leaf spring assemblies 30 such that an oscillation frequency of the mirror 12 increases with an increase in oscillation amplitude (i.e., tilt angle amplitude) in a non-linear manner. Thus, the stiffening of the leaf springs 32 as the mirror rotates causes the MEMS mirror 12 to be more strongly non-linear.

FIG. 2 is a schematic block diagram of the LIDAR scanning system 200 in accordance with one or more embodiments. In particular, FIG. 2 shows additional features of the LIDAR scanning system 200, including example processing and control system components such as a MEMS driver, a receiver circuit, and a system controller.

The LIDAR scanning system 200 includes a transmitter unit 21 that is responsible for an emitter path of the system 200, and a receiver unit 22 that is responsible for a receiver path of the system 200. The system also includes a system controller 23 that is configured to control components of the transmitter unit 21 and the receiver unit 22, and to receive raw data from the receiver unit 22 and perform processing thereon (e.g., via digital signal processing) for generating object data (e.g., point cloud data). Thus, the system controller 23 includes at least one processor and/or processor circuitry for processing data, as well as control circuitry, such as a microcontroller, that is configured to generate control signals. The LIDAR scanning system 200 may also include a temperature sensor 26.

The receiver unit 22 includes the photodetector array 15 as well as a receiver circuit 24. The receiver circuit 24 may include one or more circuitries or sub-circuitries for receiving and/or processing information. The receiver circuit 24 may receive the analog electrical signals from the APD diodes of the photodetector array 15 and transmit the electrical signals as raw analog data or raw digital data to the system controller 23. In order to transmit the raw data as digital data, the receiver circuit 24 may include an ADC and a field programmable gate array (FPGA). The receiver circuit 24 may also receive trigger control signals from the system controller 23 that triggers an activation of one or more APD diodes. The receiver circuit 24 may also receive gain setting control signals for controlling the gain of one or more APD diodes.

The transmitter unit 21 includes the illumination unit 10, the MEMS mirror 12, and a MEMS driver 25 configured to drive the MEMS mirror 12. In particular, the MEMS driver 25 actuates and senses the rotation position of the mirror, and provides position information (e.g., tilt angle or degree of rotation about the rotation axis) of the mirror to the system controller 23. Based on this position information, the laser sources of the illumination unit 10 are triggered by the system controller 23 and the photodiodes (e.g., APD diodes) are activated to sense, and thus measure, a reflected light signal. Thus, a higher accuracy in position sensing of the MEMS mirror results in a more accurate and precise control of other components of the LIDAR system.

The MEMS driver 25 may also measure and record mirror frequency and currents using a change in capacitance in a comb-drive rotor and stator of an actuator structure used to drive the MEMS mirror 12. The actuator structure of the MEMS mirror 12 further includes the suspension structure discussed above. Thus, the MEMS driver 25 may further include a measurement circuit configured to measure one or more characteristics of the MEMS mirror 12 described herein. The MEMS driver 25 may further include processing circuitry, including at least one processor (e.g., analog signal processing circuitry and/or digital signal processing circuitry) configured to process measurement information from the measurement circuit to evaluate a mechanical health of the MEMS mirror 12 and/or the state of the chip package.

Additionally, or alternatively, the system controller 23 may receive measurement information from the measurement circuit of the MEMS driver 25 and perform processing thereon. Thus, system controller 23 may further include processing circuitry, including at least one processor (e.g., analog signal processing circuitry and/or digital signal processing circuitry) configured to process measurement information from the measurement circuit to evaluate a mechanical health of the MEMS mirror 12 and/or the state of the chip package.

By sensing the rotation position of the MEMS mirror 12 about its rotation axis 13, the MEMS driver 25 can sense zero-crossing events of the MEMS mirror 12. A zero-crossing event is an instance when the MEMS mirror 12 has a rotation angle of 0° on its rotation axis 13. Specifically, it is the moment when the MEMS mirror 12 is parallel to the frame or in a neutral position. The neutral position may also be referred to as a resting position (e.g., when the MEMS mirror 12 comes to a stop after turning off the driving force). Since the MEMS mirror 12 oscillates back and forth between two rotation directions (e.g., clock-wise and counter-clockwise), a zero-crossing event occurs twice during a scanning period—once as the mirror oscillates in the first rotation direction and once as the mirror oscillates in the second rotation direction. It will also be appreciated that angle-crossing events at another predefined angle may also be used instead of a zero-crossing event.

In some embodiments, an event time may correspond to a non-zero-crossing event. For example, the sensed rotation angle may be some angle other than 0°. However, for the purpose of explanation, examples herein will be described in the context of sensing zero-crossing events.

The MEMS driver 25 is configured to detect each zero-crossing event and record a timing for each event. This timing information (i.e., measured zero-crossing time) can then be transmitted to the system controller 23 as position information. Specifically, the MEMS driver 25 triggers a change in the output of a position signal (position_L) at each zero-crossing event or angle-crossing event.

Figure 3:
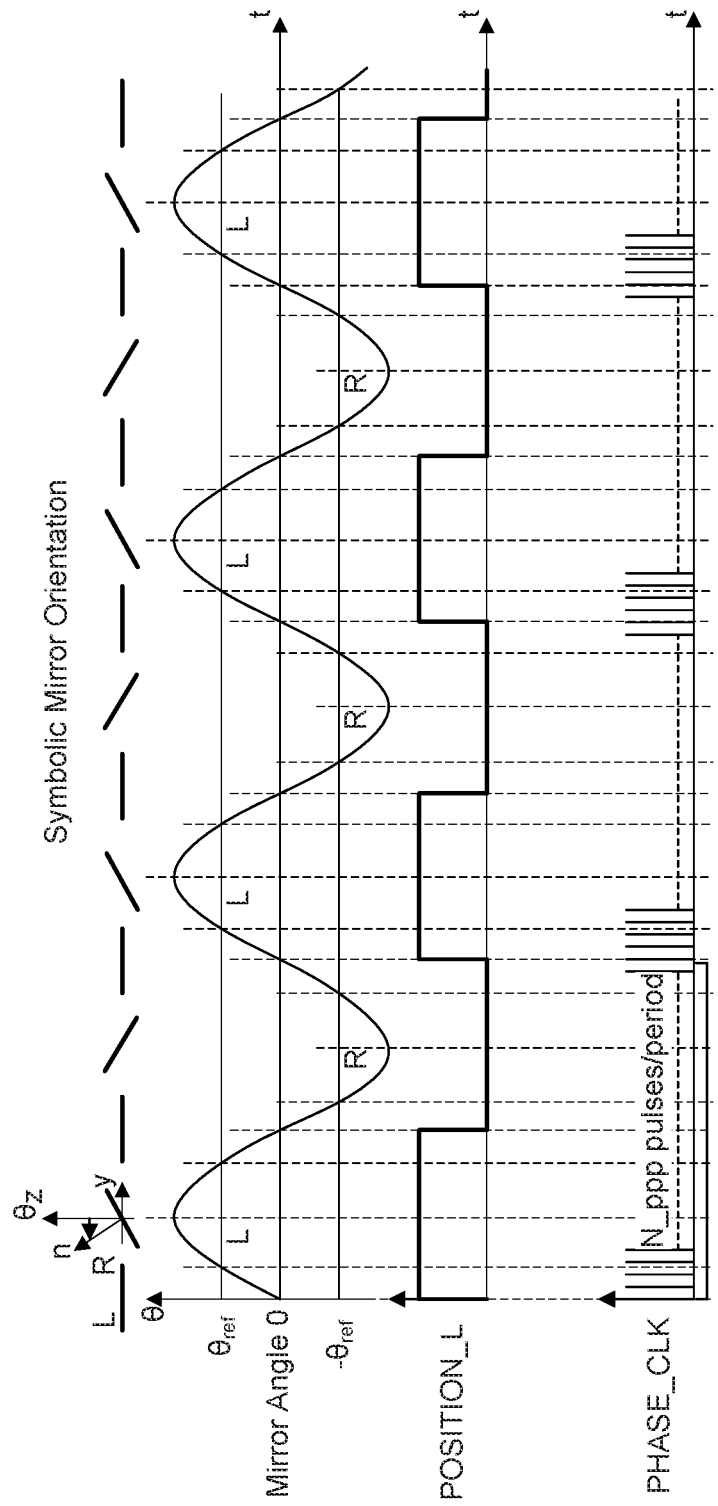
FIG. 3 illustrates a signal diagram of various signals generated by a MEMS driver based on a mirror angle θ and/or position according to one or more embodiments.

FIG. 3 illustrates a signal diagram of various signals generated by a MEMS driver 25 based on the mirror angle θ and/or position, including a position signal (position_L). For example, the position signal (position_L) may be a pulsed signal during which a first pulse transition (e.g., falling-edge transition) is triggered at a zero-crossing as the mirror oscillates in a first rotation direction (e.g., from left to right) and a second pulse transition (e.g., rising-edge transition) is triggered at a zero-crossing as the mirror oscillates in a second rotation direction (e.g., from right to left). Furthermore, the signal is "high" when the mirror points in one direction (e.g., points left) and the signal is "low" when the mirror points in a second direction (e.g., points right). Thus, the position signal not only indicates a zero-crossing event by triggering a pulse transition, but also indicates absolute phase information by indicating the directional tilt of the mirror. As the interval between zero-crossing events increase, so does the frequency of the position signal. Based on this position signal both a phase and/or a frequency of two or more position signals can be compared.

Alternatively, a short pulse may be generated by the MEMS driver 25 at the each zero-crossing event such that a pulsed position signal (position_L) is output to the system controller 23. That is, the signal remains low (or high) between zero-crossing pulses. In this case, the absolute phase information indication which direction the mirror is moving would be absent. Based on this position signal a phase and/or a frequency of two or more position signals can be compared.

The MEMS driver 25 may send the position information to the system controller 23 so that the system controller 23 can use the position information to control the triggering of the laser pulses of the illumination unit 10 and the activation of the photodiodes of the photodetector array 15. The position information may also be used by the system controller as feedback information such that the system controller 23 can maintain a stable operation of the MEMS mirror 12 via control signals provided to the MEMS driver 25 and also maintain synchronization with other MEMS mirrors.

The timing information of the zero-crossing events may also be used by the MEMS driver 25 to generate a phase clock signal (Phase_CLK). The phase clock signal is a high frequency signal (e.g., 14 MHz) of a fixed number of pulses that provides fine-grained phase information of the MEMS mirror 12. In this case, the mirror movement is divided into equidistant slices (affected by quantization errors of a digitally controlled oscillator (DCO) frequency generator) in the time-domain. A "slice" may be regarded as a subsection of a time interval between two consecutive zero-crossing events. Specifically, the time interval between two zero-crossing events (i.e., between two Position_L signals or pulses) is divided into identical fractions such that a signal pulse is generated at each fraction. Thus, the phase clock signal is pulse signal whose frequency depends on the time interval between two zero-crossing events, where the shorter the time interval, the higher the frequency. Thus, the phase clock signal divides the mirror movement in a well-defined number of phase-slices. The MEMS driver 25 may generate and output the phase clock signal to the system controller 23.

FIG. 3 further illustrates a phase clock signal (Phase_CLK) comprising a number of pulses per oscillation period, where the oscillation period is defined by a time interval between two consecutive zero-crossing events.

The MEMS mirror 12 includes an actuator structure used to drive the mirror. The actuator structure includes interdigitated finger electrodes made of interdigitated mirror combs and frame combs to which a drive voltage (i.e., an actuation or driving signal) is applied by the MEMS driver 25. The drive voltage may be referred to as a high-voltage (HV). The drive voltage applied to the finger structure generates a corresponding capacitance. The drive voltage across the finger structure creates a driving force between interdigitated mirror combs and the frame combs, which creates a torque on the mirror body about the rotation axis. The drive voltage can be switched or toggled on and off resulting in an oscillating driving force. The oscillating driving force causes the mirror to oscillate back and forth on its rotation axis between two extrema. Depending on the configuration, this actuation can be regulated or adjusted by adjusting the drive voltage off time, a voltage level of the drive voltage, or a duty cycle.

In other embodiments, an electromagnetic actuator may be used to drive the MEMS mirror 12. For an electromagnetic actuator, a driving current (i.e., an actuation or driving signal) may be used to generate the oscillating driving force. Thus, it will be appreciated that drive/driving voltage and drive/driving current may be used interchangeably herein to indicate an actuation signal or a driving signal, and both may generally be referred to as a driving force.

As the mirror oscillates, the capacitance between the finger electrodes changes according to the mirror's rotation position. The MEMS driver 25 is configured to measure the capacitance between the interdigitated finger electrodes, and determine a rotation position or angle position of the MEMS mirror 12 therefrom. By monitoring the capacitance, the MEMS driver 25 can detect the zero-crossing events and a timing thereof, and can determine the tilt angle of the MEMS mirror 12 at any given moment. The MEMS driver 25 can also use the measured capacitance to determine a mirror frequency, and record the information in memory at the MEMS driver 25 or at the system controller 23.

The sensing of the position of the MEMS mirror 12 is performed based on a detector that is configured to measure the capacitance. For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., tilt angle) of the MEMS mirror. By sensing the capacitance of the finger structure, the MEMS driver 25 can monitor and track the oscillations of the mirror, and determine a specific position of the MEMS mirror, including the zero-crossing.

One way to measure the capacitance is to measure a current flowing through the finger structure, convert the measured current into a voltage, and then further correlate the voltage to a capacitance and/or a rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions. The MEMS driver 25 can also record the currents and voltages measured during the measuring of the capacitance. Thus, increasing the accuracy of position sensing of the mirror may improve the overall accuracy of the LIDAR system Since the mirror is driven at an oscillation frequency (e.g., 2 kHz), when the mirror rotates in a first rotation direction (e.g., left-to-right or clockwise), it crosses a zero position (i.e., 0°) at a certain point of time. The same can be said when the mirror rotates in a second rotation direction (e.g., right-to-left or counter-clockwise), the mirror will cross the zero position at a certain point in time. These instances of crossing the zero position may be referred to as zero-crossing events which occur at zero-crossing times.

Figure 4A:
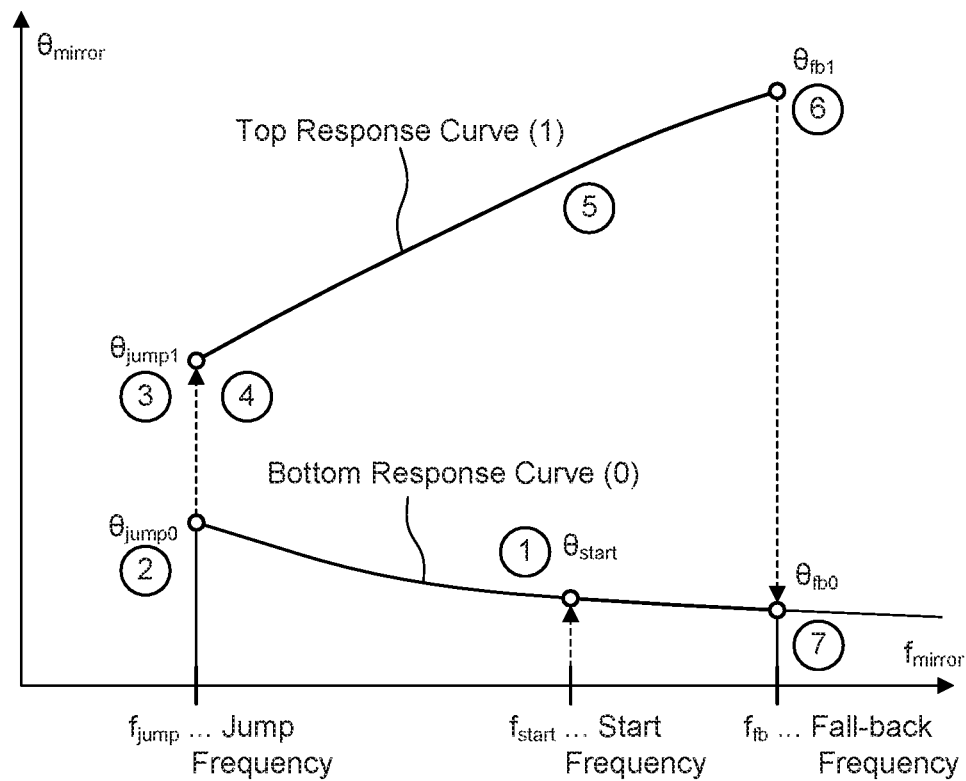
FIG. 4A illustrates an angle amplitude-frequency response curve of a micromirror device according to one or more embodiments.

FIG. 4A illustrates an angle amplitude-frequency response curve of a micromirror device according to one or more embodiments. Specifically, FIG. 4A plots the mirror angle $\theta_{mirror}$ vs. the mirror frequency $f_m$ of the MEMS mirror 12. Both axes in the plot are in arbitrary units. The complete response curve includes a top response curve (1) and a bottom response curve (0). The top response curve (1) may also be referred to as an operating response curve, where the frequency is swept across the operating range. In contrast, the bottom response curve (0) may be referred to as a non-operating response curve that exists before amplitude operating range is achieved. The complete response curve may be measured and stored in memory of the LIDAR system 200 (e.g., in the system controller 23).

The flow of the operation of the MEMS mirror progresses from point 1 to point 7, during which constant drive voltage is applied to the MEMS mirror 12 by the MEMS driver 25, will now be described. Here, "constant drive voltage" refers to the drive voltage being the same voltage when actuated (i.e., toggled on). However, it will be understood that the drive voltage is being toggled on and off in order to produce the mirror oscillation.

As noted in the previous paragraph, all points on the graph are operating at the same drive voltage provided by the MEMS driver 25. The drive voltage only stretches or compresses the curve (i.e., a higher frequency and a higher tilt angle can be reached due to more energy put it by a higher drive voltage).

The operation of the MEMS mirror starts at point 1 on the bottom response curve (0) where, at start frequency $f_{start}$. Here, the MEMS driver 25 starts the drive voltage signal to the MEMS mirror 12. In response, the MEMS mirror 12 will start to move a bit (e.g., at a low angle), depending on the value of $f_{start}$. Starting at the start frequency $f_{start}$, the mirror frequency is swept down (i.e., decreasing, right to left).

The frequency is lowered in order for the mirror to synchronize with the drive signal provided (i.e., to decrease the phase offset between the two). As more energy (i.e., constant drive voltage) is applied over time, the mirror continues to move slightly outside of resonance until the jump frequency $f_{jump}$ (point 2). That is, the mirror frequency continues to be lowered until an instability point is found and the amplitude of the mirror oscillation increases at point 2 (180 phase shift, hence jump). At the jump frequency, the mirror phase shifts 180 degrees from $\theta_{jump0}$ (point 2) to $\theta_{jump1}$ (point 3) where the energy put in is transferred into motion.

At point 4, and the mirror frequency $f_m$ starts to sweep up (i.e., increasing, left to right). The mirror phase may continue to increase along the top response curve. At point 5, the mirror is in a stable operating region (in phase, but offset). The mirror may be in an optimal resonance at point 5. However, if the mirror frequency continues to increase to point 6, the mirror phase reaches a fallback phase $\theta = \theta_{fb1}$ at a fallback frequency $f_{fb}$. Thus, the tilt angle of the mirror is at a maximum just prior to this tipping point at point 6.

The fallback frequency $f_{fb}$ is the maximum frequency the mirror can maintain at the established drive voltage. The fallback point or tipping point is the point where the potential energy put in the mirror system by the drive voltage is equal to the kinetic energy opposing it by the mirror system (in phase, no offset), pushing it over this point disturbs the balance and resonance is lost. Thus, at point 6, there is not enough energy in the system to maintain the mirror phase and the phase shifts 180 degrees and falls back to the bottom response curve (0) at fallback phase $\theta_{fb0}$.

Point 7 is the fallback point on the bottom response curve (0) and is the phase angle the mirror falls back to. This phase angle is not necessarily zero degrees since the drive voltage is still present, but the mirror is no longer in phase. The cycle can start again at point 7 or at point 1.

Figure 4B:
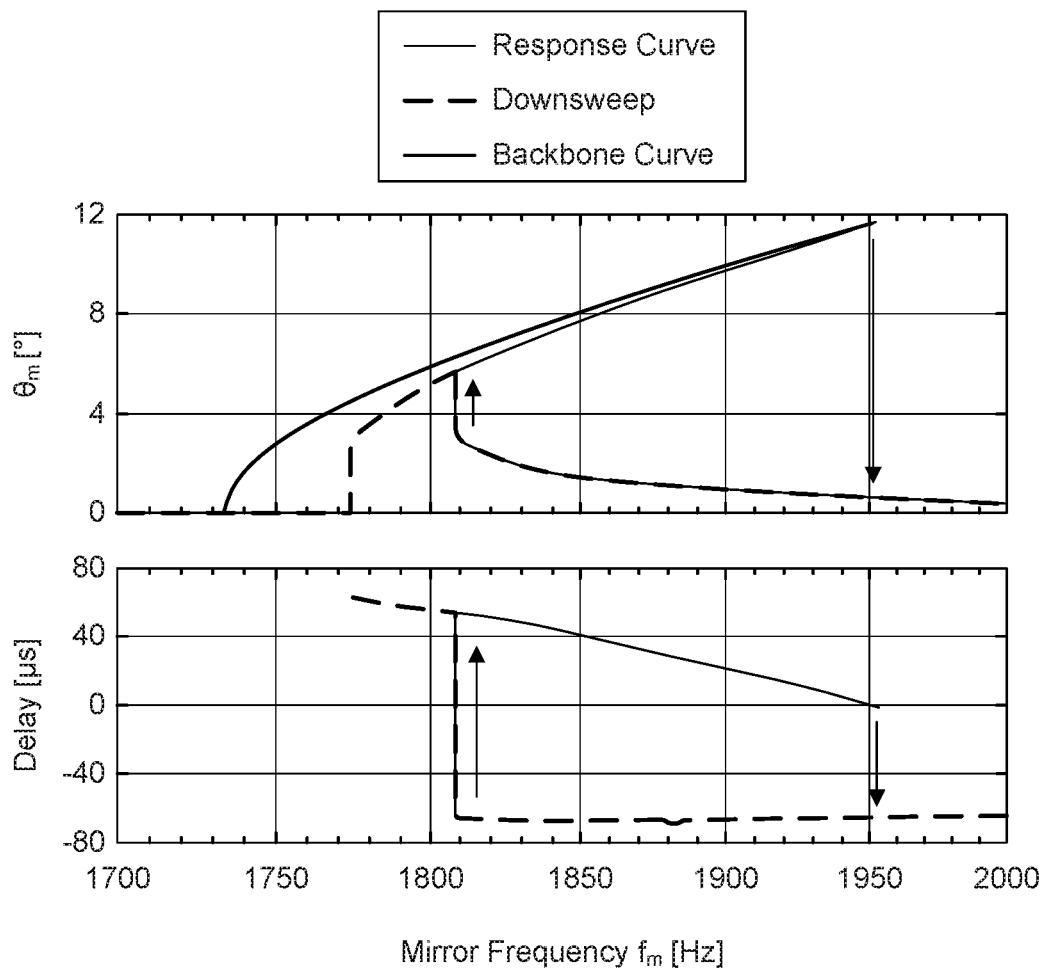
FIG. 4B illustrates an angle amplitude-frequency response curve (top) and a phase delay-frequency response curve (bottom) of a micromirror device according to one or more embodiments.

FIG. 4B illustrates an angle amplitude steady state response curve (top) and a phase delay steady state response curve (bottom) of a micromirror device according to one or more embodiments. A frequency response using 60V square wave actuation with 50% duty cycle is shown for both graphs. The frequency of the driving signal is twice the mirror frequency $f_m$. The delay is defined by the time between a zero-crossing of the mirror and the negative edge of the driving signal (i.e., the phase is positive if the zero-crossing of the mirror happens before the negative driving edge).

Embodiments are directed to a control structure for angle amplitude and phase control of a nonlinear oscillator with dependency between angle amplitude and frequency, where the amplitude-frequency (AF) dependency may be significant. If only relatively noisy amplitude measurements are available, the oscillator frequency changes can be used as an alternative to amplitude error estimation, which allows for a higher control bandwidth. The control bandwidth defines how fast the system can track a reference signal (e.g., a feedback signal).

Figure 5:
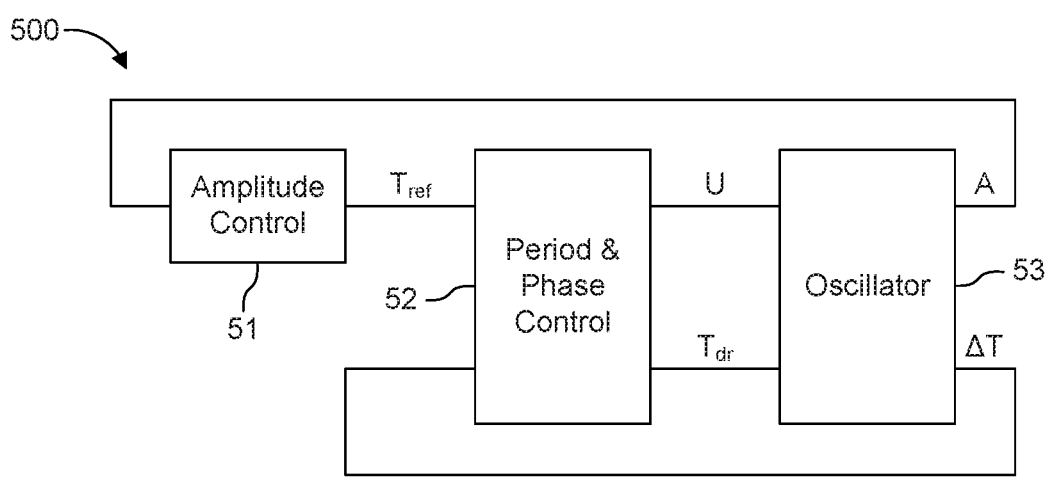
FIG. 5 illustrates a schematic block diagram of an oscillator control system according to one or more embodiments.

FIG. 5 illustrates a schematic block diagram of an oscillator control system 500 according to one or more embodiments. FIG. 5 is generic to FIGS. 6 and 7. The oscillator control system 500 includes a cascaded control structure, including a slow outer control loop and a faster inner control loop. In particular, the oscillator control system 500 includes an amplitude controller 51, representative of the outer control loop, a period and phase controller 52, representative of the inner control loop, and an oscillator 53 that includes an oscillating structure that is driven by the period and phase controller 52. The oscillating structure of the oscillator 53 is a non-linear oscillator that has a dependency between angle amplitude and frequency. The oscillator 53 may include, for example, the MEMS mirror 12 as its oscillating structure.

Thus, the two controllers 51 and 52 are cascaded in that the output of the amplitude controller 51 is provided as an input to the period and phase controller 52. The period and phase controller 52 is a Multiple Input Multiple Output (MIMO) controller configured to generate control signals U and $T_{dr}$ for driving the oscillator 53. Both outputs of the controller 52 are generated and adjusted based on both of its inputs. In addition, controller 52 is configured with a control bandwidth that is higher than the control bandwidth of controller 51.

Variable A is an angle amplitude received at the amplitude controller 51. The amplitude controller 51 has a low control bandwidth since it uses the rather noisy amplitude measurement A. The angle amplitude A is measured by a detection circuit (not illustrated).

Variable Tref is a reference oscillator period generated by the amplitude controller 51 based on the measured angle amplitude A, where an outer control loop controls the amplitude error to be zero on average (i.e., the average amplitude error is zero) while the MEMS mirror 12 is oscillating.

Variable ΔT is a phase error received at the period and phase controller 52. The phase error ΔT is measured by a detection circuit (not illustrated).

Variable U represents one or more control parameters (e.g., a voltage level, a duty cycle, a reference phase for phase control, etc.) generated by the period and phase controller 52 in response to the reference oscillator period Tref and the phase error ΔT. The period and phase controller 52 changes the control parameters U based on the reference oscillator period Tref, which in turn changes based on the amplitude measurement A, and based on the phase error ΔT. In particular, the period and phase controller 52 changes the control parameters U in combination with the driving period Tdr in order to satisfy the reference oscillator period Tref and to achieve a zero phase error.

Variable Tdr is a driving period (i.e., an oscillation period) applied by the period and phase controller 52. The period and phase controller 52 may include a driving PLL that adapts Tdr to compensate for the phase error ΔT and to achieve the reference oscillator period Tref. The period and phase controller 52 adapts Tdr with high control bandwidth due to a high signal-to-noise (SNR) phase detection signal. However, it is possible that the driving period Tdr is changed or compensated more slowly than the compensation of the control parameters U. In that case, control parameters U are changed fast while the driving period Tdr is only moderately adapted, at a slower rate than the control parameters U.

The period and phase controller 52 simultaneously generates the control parameters U and the driving period Tdr to drive the oscillator 53 to the reference oscillator period Tref and to simultaneously compensate for the phase error ΔT with high control bandwidth.

In view of the above, the oscillator control system 500 includes a slow outer loop 51, which uses (may be noisy) amplitude measurements A to derive a reference oscillator period Tref that corresponds to the desired amplitude (i.e., a reference amplitude), where the amplitude error is zero on average. The inner loop then controls the phase and oscillator period errors (and therefore the amplitude) with a high bandwidth. As a result, the oscillator control system 500 uses a precisely measurable oscillator period Tm as an amplitude equivalent parameter (A-f-Effect) and compensates deviations from the desired period and phase.

It should be mentioned that unlike, for example, a cantilever beam with dynamic tip-surface interaction, the amplitude over frequency dependency of the oscillator 53 is assumed constant or at least slowly changing. The reference oscillator period Tref for the inner loop 52 still represents the desired amplitude in a short time scale even with external disturbances. Additionally, unlike other oscillator control systems that requires both the amplitude and the frequency (or phase) measurement to be precise to achieve a high control bandwidth, the embodiments described herein only require a precise phase measurement (i.e., phase error ΔT) while the amplitude measurement A can be rather noisy and less precise.

Figure 6:
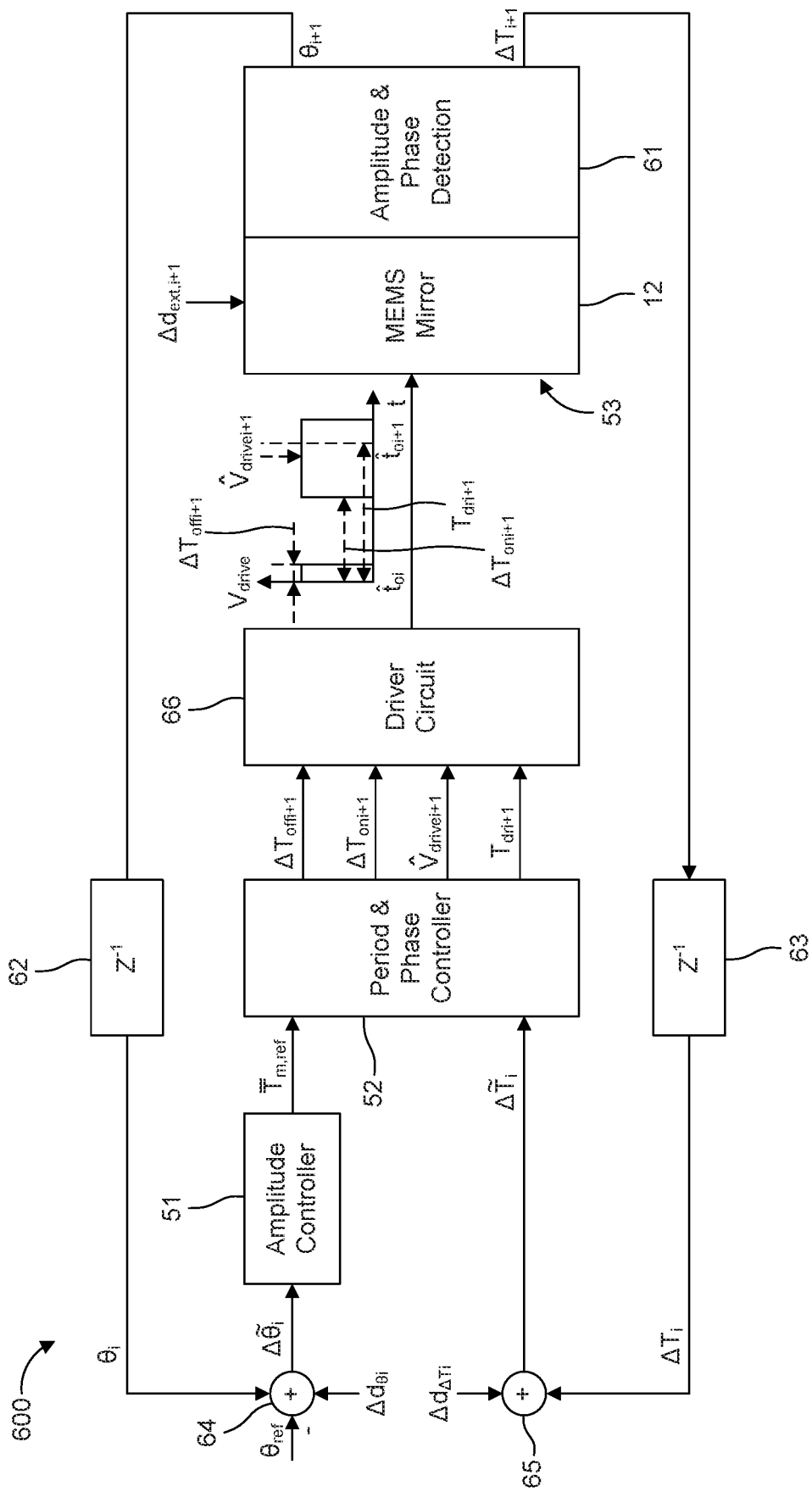
FIG. 6 illustrates a schematic block diagram of an oscillator control system according to one or more embodiments.

FIG. 6 illustrates a schematic block diagram of an oscillator control system 600 according to one or more embodiments. In particular, the oscillator control system 600 includes a full cascaded control structure, including a slow outer control loop and a faster inner control loop. Thus, similar to the oscillator control system 500, the oscillator control system 600 includes an amplitude controller 51, representative as part of the outer control loop, a period and phase controller 52, representative as part of the inner control loop, and an oscillator 53 that is driven by the period and phase controller 52. The oscillator 53 includes a MEMS mirror 12 as a non-linear oscillator that has a dependency between its angle amplitude and its frequency. The oscillator 53 further includes a detection circuit 61 that is configured to measure an angle amplitude θ (corresponding to angle amplitude A in FIG. 5) and a phase error ΔT of the MEMS mirror 12.

Due to the nonlinearities of comb-actuated MEMS mirrors, they show a significant non-linear dependency between amplitude and frequency, as shown in the open loop frequency responses shown in FIG. 4B. At high amplitudes (e.g., greater than 8°), this behavior is mainly governed by the top response curve (i.e., the backbone curve), which represents the pure mechanical behavior of the mirror.

Therefore, the mirror period reflects its amplitude and can be estimated from the phase detection signals of the driving PLL according to equation (1).

$$\tilde{T}_{m_i} = \Delta \tilde{T}_i + T_{dr_i} - \Delta \tilde{T}_{i-1}, \qquad (1)$$

where $\tilde{T}_{m_i}$ is the i-th estimated half-period of the mirror, $T_{dr_i}$ is the i-th applied driving period, $\Delta \tilde{T}_i$ is the corresponding i-th measured phase error, and $\Delta \tilde{T}_{i-1}$ is the corresponding ith-1 measured phase error (i.e., the previous measured phase error). Thus, $\Delta \tilde{T}_i$ and $\Delta \tilde{T}_{i-1}$ represent two consecutive phase errors used to calculate the mirror period. The previous phase error $\Delta \tilde{T}_{i-1}$ may be stored in memory for used in equation (1). The controller 52 calculates the driving period Tdr and the additional control parameters U based on the measured phase error, the reference oscillator period $T_{m,ref}$, and the estimated mirror period Tm, which is calculated by a controller 52 using equation (1).

For a general description, the phase error is defined as the time between a measured (actual) zero-crossing of the MEMS mirror 12 and an expected zero-crossing $\hat{t}_{o_i}$ given by the inner control loop 52. Per definition, the subsequent expected zero-crossing is calculated by $\hat{t}_{o_{i+1}} = \hat{t}_{o_i} + T_{dr_{i+1}}$, where $T_{dr_{i+1}}$ is the i-th+1 applied driving period, and so on. Thus, if $T_{dr_i}$ is the current applied driving period, then $T_{dr_{i+1}}$ is the next applied driving period. Thus, the next applied driving period is defined by the two consecutive zero-crossings $T_{dr_{i+1}} = \hat{t}_{o_{i+1}} - \hat{t}_{o_i}$.

Furthermore, in this implementation it is assumed that the feedback measurements θ and ΔT are available at the expected zero-crossing event or at least after a short processing time, which is negligible with respect to the mirror period. For example, shift registers 62 and 63 may store measurement samples θ and ΔT, respectively, to which a unit sample delay period ($z^{-1}$) is incurred.

The fully cascaded structure of the oscillator control system 600 is preferable, if equation (2) is satisfied:

$$\left|\frac{dT_m(\theta)}{d\theta}\right|\sigma_\theta > \sigma_{\tilde{T}_m}, \quad (2)$$

where θ is the mirror nominal amplitude, and $\sigma_\theta$ and $\sigma_{\tilde{T}_m}$ are the standard deviations of amplitude measurement and mirror period estimation, respectively.

In FIG. 6, the amplitude noise measurement and the phase noise measurement are depicted by $\Delta d_{\Theta_i}$ and $\Delta d_{\Delta T_i}$, respectively. These inputs correspond to the detector's noise characteristics and are added naturally to their respective amplitude and phase error measurements. For example, the actual measured phase error value consists of the true value (e.g. ΔT) and the noise/uncertainty $\Delta d_{\Delta T_i}$. In addition, $\Delta d_{ext,i+1}$ represents external disturbances (e.g., vibrations) applied to the MEMS mirror 12. The mirror period gradient $$\left|\frac{dT_m(\Theta)}{d\Theta}\right|$$

can be measured (e.g. from the response curve in FIG. 4B) calculated from the mirror dynamics, or estimated from the measured amplitude and mirror period errors. If Eq. (2) is fulfilled, the mirror period is a better estimate for mirror amplitude changes than the amplitude measurement itself. Therefore, fast changes of the mirror amplitude, induced by environmental fluctuations $\Delta d_{ext,i}$ such as vibration, can be better handled solely by the phase detection signals of the driving PLL using Eq. (1).

A slow outer loop includes an angle amplitude error generator 64 and the amplitude controller 51. The angle amplitude error generator 64 is configured to receive the i-th measured angle amplitude θi from a feedback path (e.g., from register 62) and a reference angle amplitude θref, and generate an amplitude error measurement $\Delta\tilde{\Theta}_i$ based thereon. Specifically, the reference angle amplitude θref is subtracted from the i-th measured angle amplitude θi to generate the amplitude error measurement $\Delta\tilde{\Theta}_i$. The amplitude error measurement $\Delta\tilde{\Theta}_i$ may be any measurement related to the amplitude (e.g., 6° to 0° time).

The angle amplitude error generator 64 may also receive the i-th amplitude noise measurement $\Delta d_{\Theta_i}$ and generate the amplitude error measurement $\Delta\tilde{\Theta}_i$ based on the three inputs. Specifically, the reference angle amplitude θref is subtracted from a sum of the i-th measured angle amplitude θi and the i-th amplitude noise measurement $\Delta d_{\Theta_i}$ to generate the amplitude error measurement $\Delta\tilde{\Theta}_i$.

The amplitude controller 51 generates the reference mirror period $\tilde{T}_{m,ref}$ based on the received amplitude error measurement $\Delta\tilde{\Theta}_i$, where, if the mirror is oscillating, the amplitude error is zero on average. Since the outer loop can be rather slow, the precision of the amplitude error measurement $\Delta\tilde{\Theta}_i$ is not of concern but only its accuracy. In measurements of a set, accuracy refers to the closeness of the measurements to a specific value, whereas precision refers to the closeness of the measurements to each other.

A faster inner loop includes an phase error generator 65 and the period and phase controller 52. As noted above, the phase noise is added to the true phase error naturally. The phase error generator 65 is configured to receive the i-th measured phase error $\Delta T_i$ from a feedback path (e.g., from register 63) and the phase noise measurement $\Delta d_{\Delta T_i}$ and generate a summed phase error $\Delta\tilde{T}_i$ that represents the total phase error for the i-th measurement.

The period and phase controller 52 is configured to receive the summed phase error $\Delta\tilde{T}_i$, and drive the MEMS mirror 12 to the reference mirror period $T_{m,ref}$ provided by the outer loop by using Eq. (1) and compensate for the phase error $\Delta T_i$. In particular, the period and phase controller 52 is configured to minimize the phase error ΔT and the period error between $\tilde{T}_{m_i}$ and $T_{m,ref}$. The period and phase controller 52 does this by generating the control parameters U based on the reference oscillator period $T_{m,ref}$ and the phase error ΔT and simultaneously generates the driving period Tdr also based on the reference oscillator period $T_{m,ref}$ and the phase error ΔT. Thus, both the control parameters U and the driving period Tdr are dependent on both inputs, the reference oscillator period $T_{m,ref}$ and the phase error ΔT.

In particular, the period and phase controller 52 uses Eq. (1) to calculate an estimated mirror period Tm, and then calculates the mirror period error as the difference between the estimated mirror period Tm and the reference mirror period $T_{m,ref}$. The period and phase controller 52 uses both the phase error ΔT and the period error of the MEMS mirror 12 to generate, adjust, and/or compensate both the control parameters U and the driving period Tdr.

According to Eq. (1), the period and phase controller 52 is configured to estimate the oscillator period of the oscillator structure based on the sum of the measured phase error and the driving period, less the previous measured phase error. Thus, the period and phase controller 52 is configured to estimate the oscillator period of the oscillator structure, determine an oscillator period error based on the estimated oscillator period and the reference oscillator period, and adapt the driving period and the at least one control parameter of the driving signal to compensate for both the measured phase error and the determined oscillator period error. The determined oscillator period error is a difference between the estimated oscillator period and the reference oscillator period.

As a result, the controller 52 drives the oscillator 53 to the reference oscillator period $T_{m,ref}$ to correct the period error and simultaneously compensates for the phase error ΔT. Due to the precise phase detection (e.g., the standard deviation of $\Delta d_{\Delta T_i}$ is low), fast control of the mirror amplitude and mirror phase is possible.

The oscillator control system 600 includes a driver circuit 66 configured to generate a modulated (e.g., pulse width modulated (PWM)) driving signal $V_{drive}$ (i.e., driving voltage) to drive the MEMS mirror 12. The driver circuit 66 includes a variable/configurable oscillator of a driving PLL, where the variable/configurable oscillator is used to drive the MEMS mirror 12 and maintain the MEMS mirror 12 in a steady state. The PLL includes a phase detector, a loop filter/controller, and the variable oscillator and the detection circuit 61 may extract signals from different stages of the driving PLL to make measurements related to the operation of the MEMS mirror 12. For example, the detection circuit 61 may measure the angle amplitude, the mirror period, the mirror frequency, and the mirror phase. Thus, the detection circuit 61 may be integrated with the driver circuit 66, as is also shown in FIG. 2 (see MEMS driver 25). It is noted that the period and phase controller 52 is part of the driving PLL as well as the configurable oscillator.

The driver circuit 66 modulates the driving signal $V_{drive}$, using the driving PLL, based on one or more control parameters generated by and received from the period and phase controller 52. The control parameters may be used by the driver circuit 66 to change the voltage level, a duty cycle, period, and/or a reference phase for the driving voltage. For example, the control parameters U may include $\hat{V}_{drive_{i+1}}$ used to set the driving voltage level of the drive signal, and switching parameters $\Delta T_{on_{i+1}}$ and $\Delta T_{off_{i+1}}$ that are used to modulate the timing of the switching of the driving signal. In addition, $T_{dr_{i+1}}$ is another switching parameter that sets the driving period of the driving signal defined by two consecutive expected zero-crossing times at $t_{0i}$ and $t_{0i+1}$. $\Delta T_{on_{i+1}}$ sets the turn-on time of the driving voltage in a signal period, and $\Delta T_{off_{i+1}}$ sets the turn-off time of the driving voltage in the signal period. The turn-on time defines a transition from the low voltage level to the high voltage level within the driving period $T_{dr}$, and the turn-off time defines a transition from the high voltage level to the low voltage level within the driving period $T_{dr}$.

At least two of the control parameters $\hat{V}_{drive_{i+1}}$, $\Delta T_{on_{i+1}}$, $\Delta T_{off_{i+1}}$, and $T_{dr}$ are dependent on the reference oscillator period $T_{m,ref}$ and the phase error $\Delta T$ and are adapted by controller 52 to minimize the phase and period errors. In some cases, all the control parameters are adapted based on the two inputs and are used to minimize the phase and period errors. In some cases, the driving period Tdr and at least one of the control parameters U is adapted based on the two inputs and are used to minimize the phase and period errors.

It is further noted that while square wave driving is used in the present example, it will be appreciated that other waveforms can be used. For example, a sine wave may be used and the control parameters U may include amplitude, frequency, and phase that are set by the controller 52 based on the reference oscillator period $T_{m,ref}$ and the phase error $\Delta T$.

To achieve a fast amplitude control by changing the driving voltage level $\hat{V}_{drive_{i+1}}$, a low settling time should be used in order to reach the desired amplitude value within $\Delta T_{on_{i+1}}$. However, if the driving voltage can be changed quickly, the phase detection by means of current sensing, for example, may be noisier due to the increased bandwidth as $$I = V\frac{dC}{dt} + C\frac{dV}{dt},$$

where the second term should be zero in an ideal case.

In order to achieve a large control bandwidth without introducing more noise to the current sensing, the driving voltage $V_{drive}$ is considered as only switchable between two voltage level states, for example, 0V and some voltage value different from 0V (i.e., $\hat{V}_{drive}$), while the control is performed by adjusting the timing of the switching (i.e., using control parameters $T_{dr_{i+1}}$, $\Delta T_{on_{i+1}}$ and $\Delta T_{off_{i+1}}$). However, in order to compensate for slow drifts of environmental conditions (e.g., pressure changes and aging), the non-zero state of the driving voltage can also be slowly adapted, without harming the sensing.

The amplitude controller 51 and period and phase controller 52 may be nonlinear or linear controllers, designed by a suitable MEMS mirror model. One possibility using a simple low gain Proportional Integral (PI)-controller for the amplitude controller 51 and a Linear Quadratic-Gaussian (LQG) regulator for the period and phase controller 52, designed by a linearized model at the desired operation point. Also, a feedforward algorithm can be implemented that provides, for example, fast amplitude changes.

To reduce the control degree of freedom (DoF), the turning on of the driving voltage $V_{drive}$ can be fixed as $$\Delta T_{on_{i+1}} = \frac{T_{dr_{i+1}}}{2}.$$

Therefore, the voltage is turned on at the maximum angle point (i.e., the maximum amplitude point) where the comb drives do not produce a significant torque. The remaining control DoFs are the turning off time $\Delta T_{off_{i+1}}$ and the driving period $T_{dr_{i+1}}$.

As the driving period $T_{dr_{i+1}}$ defines the next expected zero-crossing, it directly influences the next phase error, while $\Delta T_{off_{i+1}}$ effects only the mirror dynamics by injecting energy or draining energy out. In order to achieve fast convergence to the reference mirror period $T_{m,ref}$ and also low variation of the driving period due to sensing noise, $\Delta T_{off_{i+1}}$ should react faster on the phase error and period error than on the driving period $T_{dr_{i+1}}$.

In view of the above, the outer loop regulates the mirror reference mirror period $\overline{T}_{m,ref}$ for the inner loop such that the amplitude error becomes zero on average. The inner loop drives the MEMS mirror 12 to the desired mirror reference period and compensates for the residual phase error $\Delta T_i$ using both the control parameters U and the driving period $T_{dr}$.

Figure 7:
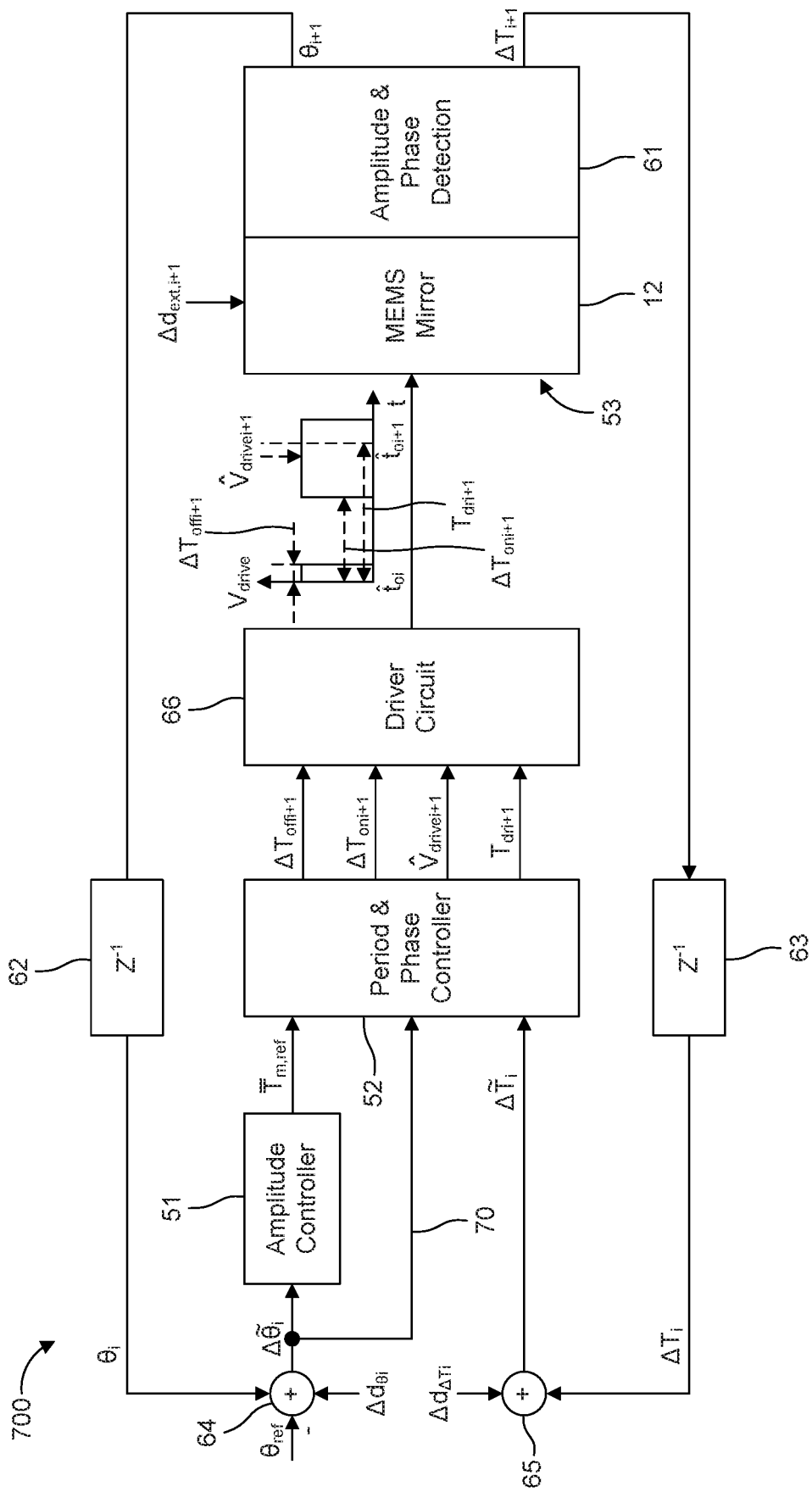
FIG. 7 illustrates a schematic block diagram of an oscillator control system according to one or more embodiments.

FIG. 7 illustrates a schematic block diagram of an oscillator control system 700 according to one or more embodiments. In particular, the oscillator control system 700 includes a mixed-cascaded control structure, including a slow outer control loop and a faster inner control loop. The oscillator control system 700 is the same as the oscillator control system 600 depicted in FIG. 6, except the oscillator control system 700 include a supplemental feedback path 70 that is coupled to the output of the angle amplitude error generator 64 at one end and is coupled to an input of the period and phase controller 52 at the other end. Thus, the supplemental feedback path 70 bypasses the amplitude controller 51 and supplies the amplitude error measurement $\Delta\tilde{\Theta}_i$ directly to the period and phase controller 52, which uses both the received amplitude error measurement and the estimated mirror period error to control the parameters Tdr and U. The estimated mirror period error is the difference between estimated mirror period Tm and the reference mirror period $T_{m,ref}$.

The supplemental feedback path 70 is used when equation (2) is not fulfilled. For example, if $$\left|\frac{dT_m(\Theta)}{d\Theta}\right|\sigma_\Theta \approx \sigma_{\hat{T}_m}$$

or at least for some conditions of external influences, the mirror period variations do not represent the amplitude correctly, the mixed-cascaded implementation is preferable since the combination of direct and indirect amplitude measurement leads to a better detection SNR. Therefore, the amplitude error measurement is forwarded to the inner loop as shown.

As a result, the period and phase controller 52 receives the reference mirror period $\overline{T}_{m,ref}$ and the summed phase error $\Delta\tilde{T}_i$, as described in FIG. 6, as well as the amplitude error measurement $\Delta\tilde{\Theta}_i$. The period and phase controller 52 uses the amplitude error measurement $\Delta\tilde{\Theta}_i$ to reduce the measurement uncertainty and to calculate the control parameters U and the driving period Tdr in order to drive the MEMS mirror 12 to the reference mirror period $T_{m,ref}$ and to minimize the phase error.

In systems 500, 600, and 700, the amplitude controller 51 and the period and phase controller 52 may include of a combination of feedforward and feedback algorithms. Feedback signals may be period-to-period measurements or continuous/sampled signals. The feedforward and feedback algorithms may be designed by an oscillator model, which may be derived by a measured oscillator response or by a mathematical model.

Additionally, an offline model identification or an online model identification by a dedicated identification procedure and algorithm may be implemented. Offline model identification can use a nonlinear model of the MEMS mirror 12 or a linearized model that is valid around the desired operation point of the MEMS mirror 12. The identification is done once and the MEMS mirror 12 is operated with the same parameters. Online model identification can use a nonlinear model of the MEMS mirror 12 or a linearized model that is valid around the desired operation point of the MEMS mirror 12. The identification is done during operation of the MEMS mirror 12 by observing the dedicated parameters.

A regulation loop (e.g., the detection circuit 61 and the system controller 23) compares a measured reaction of the MEMS mirror 12 on regulation processes with an expected reaction, and, based on the comparison result, determines a so called actual amplitude/frequency characteristic of the MEMS mirror 12 during operation. If this characteristic changes with time in comparison to an oscillator model, and if this change cannot be explained by the temperature dependency, then this may be an indication of mechanical degeneration of the MEMS mirror 12. This may be reported to the system controller 23 to signal a request of a timely exchange of the MEMS mirror 12 before it breaks during operation. Thus, replacement of the MEMS mirror 12 can be anticipated by monitoring operation deviations from an expected model.

One example of the online identification is to estimate the local mirror amplitude over frequency behavior (i.e., the A-f-effect). Using signals extracted from the driving PLL, the detection circuit 61 measures the angle amplitude and the mirror period and the system controller 23 evaluates, for example, the following equation $\Delta\Theta_m = \hat{k}\Delta T_m$ where $\Theta_m$ and $T_m$ are vectors containing the measured values for angle amplitude and the mirror period, respectively, and $\hat{k}$ is the observed scalar parameter (e.g., fitted by least squares). The delta symbol $\Delta$ at the variables indicates a deviation from their nominal value, and thus is a delta value of the measured value and the corresponding nominal value. In other words, $\Delta\Theta_m$ and $\Delta T_m$ are error values for the measured angle amplitude and the mirror period. The nominal value is defined by the desired operation point at which the mirror should operate. The observed parameter $\hat{k}$ can then be used for control or for fatigue detection if it suddenly changes. When a sudden change in parameter $\hat{k}$ is detected (e.g., parameter $\hat{k}$ exceeds a threshold value), the system controller 23 may generate a warning signal indicating that the MEMS mirror 12 should be replaced.

Although embodiments described herein relate to a MEMS device with a mirror, it is to be understood that other implementations may include optical devices other than MEMS mirror devices, including other non-linear oscillating structures, including those not related to LIDAR. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. An oscillator control system, comprising:
    an oscillator structure configured to oscillate about an axis, wherein an angle amplitude and a frequency of the oscillator structure have a non-linear dependency;
    a driver circuit configured to generate a driving signal to drive an oscillation of the oscillator structure;
    a detection circuit configured to measure the angle amplitude and a phase error of the oscillator structure;
    an outer control loop comprising an amplitude controller configured to generate a reference oscillator period based on the measured angle amplitude; and
    an inner control loop comprising a period and phase controller configured to receive the reference oscillator period from the outer control loop and the measured phase error from the detection circuit, generate at least one control parameter of the driving signal based on the reference oscillator period and the measured phase error, and determine a driving period of the driving signal based on the reference oscillator period and the measured phase error,
    wherein the driver circuit is configured to generate the driving signal based on the at least one control parameter of the driving signal and the driving period,
    wherein the period and phase controller is configured to estimate an oscillator period of the oscillator structure, determine an oscillator period error based on the estimated oscillator period and the reference oscillator period, and adapt the driving period and the at least one control parameter of the driving signal to compensate for both the measured phase error and the determined oscillator period error, and
    wherein the determined oscillator period error is a difference between the estimated oscillator period and the reference oscillator period.

2. The oscillator control system of claim 1, wherein:
    the outer control loop further comprises an amplitude error generator configured to receive the measured angle amplitude and a reference angle amplitude, and generate an amplitude error measurement based on a difference between the measured angle amplitude and the reference angle amplitude, and
    the amplitude controller is configured to receive the amplitude error measurement and generate the reference oscillator period based on the amplitude error measurement.

3. The oscillator control system of claim 2, wherein the amplitude controller is configured to generate the reference oscillator period based on the amplitude error measurement such that the amplitude error measurement becomes zero on average while the oscillator structure is oscillating.

4. The oscillator control system of claim 2, further comprising:
    a supplemental feedback path coupled to an output of the amplitude error generator and configured to transmit the amplitude error measurement to the period and phase controller,
    wherein the period and phase controller is configured to receive the amplitude error measurement, the reference oscillator period, and the measured phase error, and generate the at least one control parameter of the driving signal and the driving period based on the received amplitude error measurement, the received reference oscillator period, and the measured phase error.

5. The oscillator control system of claim 1, wherein the period and phase controller is configured to estimate the oscillator period of the oscillator structure based on the measured phase error, the driving period, and a previous measured phase error.

6. The oscillator control system of claim 1, wherein:
    the inner control loop further comprises a phase error generator configured to receive a noise measurement and the measured phase error, and generate a summed phase error from the noise measurement and the measured phase error, and
    the period and phase controller is configured to determine the driving period of the driving signal and the at least one control parameter of the driving signal based on the summed phase error, wherein the period and phase controller adapts the driving period and the at least one control parameter of the driving signal to compensate for the summed phase error.

7. The oscillator control system of claim 1, wherein the measured phase error is defined by a time difference between a measured time at which a zero-crossing of the oscillator structure occurs and an expected time at which the zero-crossing of the oscillator structure is expected to occur.

8. The oscillator control system of claim 1, wherein the driving period is defined by two consecutive expected zero-crossing times of the oscillator structure.

9. The oscillator control system of claim 1, wherein the amplitude controller has a first control bandwidth and the period and phase controller has a second control bandwidth greater than the first control bandwidth.

10. The oscillator control system of claim 1, wherein the at least one control parameter includes at least one of a voltage level of the driving signal, a duty cycle of the driving signal, or a reference phase of the driving signal.

11. The oscillator control system of claim 10, wherein the driving signal is a pulse width modulated (PWM) signal that switches between a low voltage level and a high voltage level, the driving circuit is configured to adjust at least one of the low voltage level or the high voltage level of the driving signal based on the at least one control parameter.

12. The oscillator control system of claim 10, wherein the driving signal is a pulse width modulated (PWM) signal that switches between a low voltage level and a high voltage level,
the driving circuit is configured to adjust at least one of a turn-on time or a turn-off time of the driving signal, wherein the turn-on time defines a transition from the low voltage level to the high voltage level within the driving period and the turn-off time defines a transition from the high voltage level to the low voltage level within the driving period.

13. A method for controlling an oscillator structure configured to oscillate about an axis according to a driving signal, wherein an angle amplitude and a frequency of the oscillator structure have a non-linear dependency, the method comprising:
measuring the angle amplitude of the oscillator structure;
measuring a phase error of the of the oscillator structure;
generating a reference oscillator period based on the measured angle amplitude;
determining an estimated oscillator period of the oscillator structure;
determining an oscillator period error as a difference between the estimated oscillator period and the reference oscillator period;
generating at least one control parameter of the driving signal based on the oscillator period error and the measured phase error, including adapting the at least one control parameter of the driving signal to compensate for the measured phase error;
determining a driving period of the driving signal based on the oscillator period error and the measured phase error, including adapting the driving period to compensate for the measured phase error; and
generating the driving signal based on the at least one control parameter of the driving signal and the driving period.

14. The method of claim 13, further comprising:
generating an amplitude error measurement based on a difference between the measured angle amplitude and a reference angle amplitude; and
generating the reference oscillator period based on the amplitude error measurement.

15. The method of claim 14, wherein generating the amplitude error measurement includes generating the reference oscillator period based on the amplitude error measurement such that the amplitude error measurement becomes zero on average while the oscillator structure is oscillating.

16. The method of claim 14, further comprising:
generating the at least one control parameter of the driving signal and the driving period based on the amplitude error measurement, the reference oscillator period, and the measured phase error, wherein the amplitude error measurement and the reference oscillator period are used as separate inputs for generating the at least one control parameter and for determining the driving period.

17. The method of claim 13, further comprising:
generating a summed phase error from a noise measurement and the measured phase error,
wherein determining the driving period of the driving signal includes determining the driving period of the driving signal based on the summed phase error, including adapting the driving period to compensate for the summed phase error, and
wherein generating the at least one control parameter includes generating the at least one control parameter based on the summed phase error, including adapting the at least one control parameter to compensate for the summed phase error.

18. The method of claim 13, wherein the measured phase error is defined by a time difference between a measured time at which a zero-crossing of the oscillator structure occurs and an expected time at which the zero-crossing of the oscillator structure is expected to occur.

19. The method of claim 13, wherein the driving period is defined by two consecutive expected zero-crossing times of the oscillator structure.

20. The method of claim 13, wherein the at least one control parameter includes at least one of a voltage level of the driving signal, a duty cycle of the driving signal, or a reference phase of the driving signal.

21. The method of claim 20, wherein the driving signal is a pulse width modulated (PWM) signal that switches between a low voltage level and a high voltage level, the method further comprising:
adjusting at least one of the low voltage level or the high voltage level of the driving signal based on the at least one control parameter.

22. The method of claim 20, wherein the driving signal is a pulse width modulated (PWM) signal that switches between a low voltage level and a high voltage level, the method further comprising:
adjusting at least one of a turn-on time or a turn-off time of the driving signal, wherein the turn-on time defines a transition from the low voltage level to the high voltage level within the driving period and the turn-off time defines a transition from the high voltage level to the low voltage level within the driving period.

23. A Light Detection and Ranging (LIDAR) control system, comprising:
a microelectromechanical system (MEMS) mirror configured to oscillate about an axis, wherein an angle amplitude and a frequency of the MEMS mirror have a non-linear dependency;
a driver circuit configured to generate a driving signal to drive an oscillation of the MEMS mirror;
a detection circuit configured to measure the angle amplitude and a phase error of the MEMS mirror;
an outer control loop comprising an amplitude controller configured to generate a reference mirror period based on the measured angle amplitude; and
an inner control loop comprising a period and phase controller configured to receive the reference mirror period from the outer control loop and the measured phase error from the detection circuit, generate at least one control parameter of the driving signal based on the reference mirror period and the measured phase error, and determine a driving period of the driving signal based on the reference mirror period and the measured phase error,
wherein the period and phase controller is configured to:
determine an estimated oscillator period of the MEMS mirror,
determine an oscillator period error as a difference between the estimated oscillator period and a reference oscillator period, generate the at least one control parameter of the driving signal based on the determined oscillator period error and the measured phase error, and determine the driving period of the driving signal based on the determined oscillator period error and the measured phase error, and wherein the driver circuit is configured to generate the driving signal based on the at least one control parameter of the driving signal and the driving period.

24. The LIDAR control system of claim 23, wherein:

the inner control loop further comprises a phase error generator configured to generate a summed phase error based on the measured phase error, and the period and phase controller is configured to determine the driving period of the driving signal and the at least one control parameter of the driving signal based on the summed phase error, wherein the period and phase controller adapts the driving period and the at least one control parameter of the driving signal to compensate for the summed phase error.

25. The LIDAR control system of claim 23, wherein the measured phase error is defined by a time difference between a measured time at which a zero-crossing of an oscillator structure occurs and an expected time at which the zero-crossing of the oscillator structure is expected to occur.

26. The LIDAR control system of claim 25, wherein the driving period is defined by two consecutive expected zero-crossing times of the oscillator structure.

* * * * *